US012660641B2

(12) United States Patent
Jeon et al.

(10) Patent No.: US 12,660,641 B2
(45) Date of Patent: Jun. 16, 2026

(54) SEMICONDUCTOR DEVICES HAVING WETTABLE FLANKS AND METHODS OF MANUFACTURING SEMICONDUCTOR DEVICES

(71) Applicant: Amkor Technology Singapore Holding Pte. Ltd., Valley Point #12-03 (SG)

(72) Inventors: Hyeong Il Jeon, Gyeonggi-do (KR); Byong Jin Kim, Seoul (KR); Gi Jeong Kim, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 587 days.

(21) Appl. No.: 17/947,109

(22) Filed: Sep. 17, 2022

(65) Prior Publication Data

US 2024/0096766 A1 Mar. 21, 2024

(51) Int. Cl.
H01L 23/495 (2006.01)
H01L 21/48 (2006.01)

(52) U.S. Cl.
CPC .... H01L 23/49565 (2013.01); H01L 21/4828 (2013.01); H01L 21/4842 (2013.01); H01L 23/49534 (2013.01); H01L 23/49558

(2013.01); H01L 23/49562 (2013.01); H01L 23/49582 (2013.01); H01L 23/49586 (2013.01); H01L 23/49548 (2013.01)

(58) Field of Classification Search
CPC ....... H01L 23/49558; H01L 23/49541–49565; H01L 23/49838–49844; H01L 23/49503; H01L 23/49506; H01L 23/49513
See application file for complete search history.

(56) References Cited

U.S. PATENT DOCUMENTS

2020/0365478 A1* 11/2020 Lu ........................... H01L 21/56
2022/0115301 A1 4/2022 Bowers
2022/0115304 A1 4/2022 Bowers

* cited by examiner

*Primary Examiner* — Khaja Ahmad
*Assistant Examiner* — Candice Chan
(74) *Attorney, Agent, or Firm* — Kevin B. Jackson

(57) ABSTRACT

In one example, a semiconductor device includes a substrate. The substrate includes a base including a top side and a cavity side opposite to the top side, leads extending from the cavity side, and an encapsulant interposed between the leads. An electronic component is located on the cavity side and spaced apart from the encapsulant. Other examples and related methods are also disclosed herein.

17 Claims, 18 Drawing Sheets

Section B-B

Section A-A

Section B-B

Section A-A

Section B-B

Section A-A

Section B-B

Section A-A

Section B-B

Section A-A

SEMICONDUCTOR DEVICES HAVING WETTABLE FLANKS AND METHODS OF MANUFACTURING SEMICONDUCTOR DEVICES

CROSS-REFERENCE TO RELATED APPLICATIONS

Not Applicable.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1A:
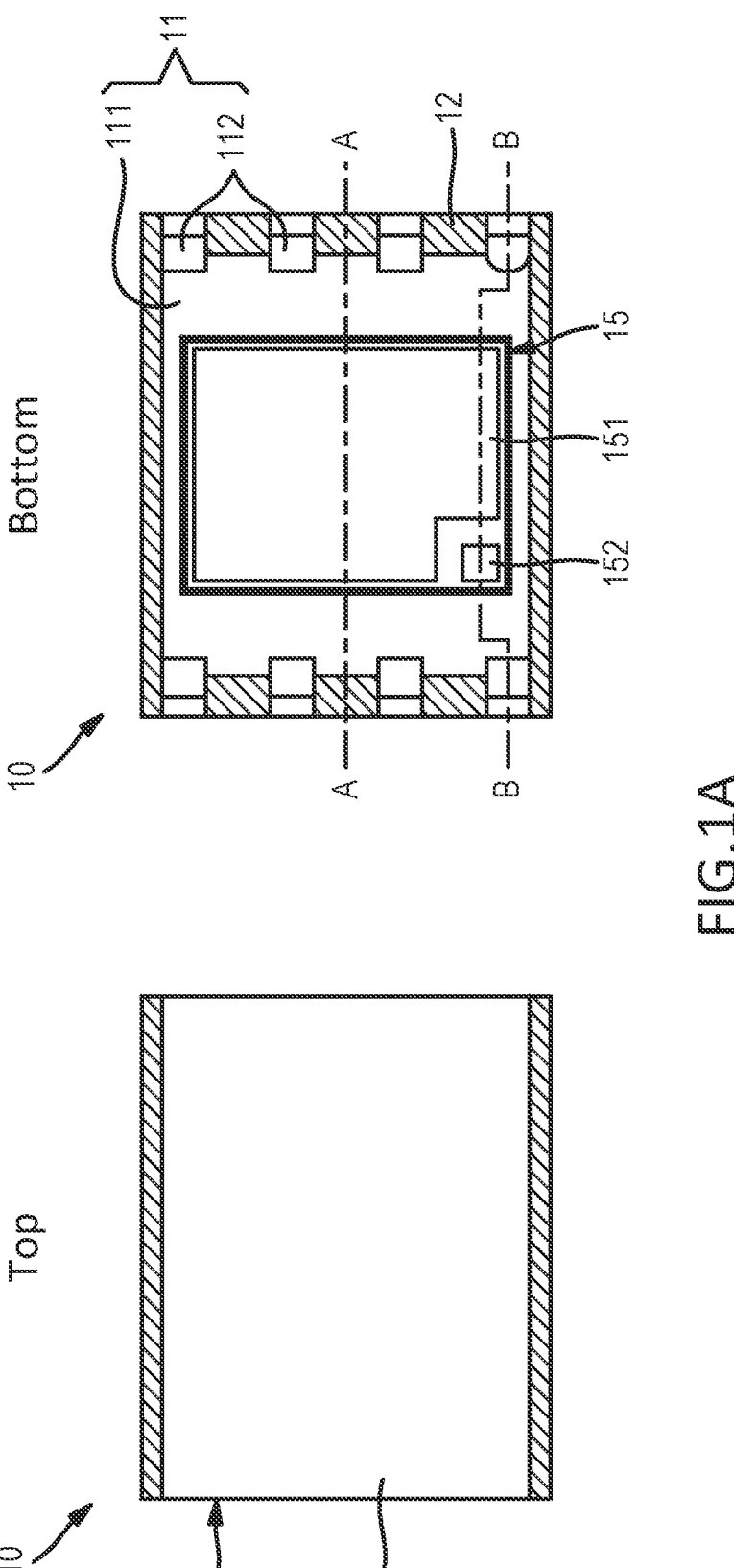
FIGS. 1A and 1B show plan views and cross-sectional views, respectively, of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. Crosshatching lines may be used throughout the figures to denote different parts but not necessarily to denote the same or different materials. Throughout the present disclosure, like reference numbers denote like elements. Accordingly, elements with like element numbering may be shown in the figures but may not be necessarily repeated herein for the sake of clarity.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. As used herein, the term coupled can refer to an electrical coupling or a mechanical coupling. Similarly, the terms "over" or "on" may be used to describe two elements directly contacting each other or describe two elements indirectly connected by one or more other elements.

DESCRIPTION

In an example, a semiconductor device comprises a substrate. The substrate comprises a base comprising a top side and a cavity side opposite to the top side. Leads extend from the cavity side and an encapsulant is interposed between the leads. An electronic component is located on the cavity side and spaced apart from the encapsulant.

In an example, an electronic device comprises a molded substrate. The molded substrate comprises a base including a top side and a cavity side opposite to the top side. Leads extend from the cavity side of the base and an encapsulant is interposed between the leads. An electronic component is disposed on the cavity side of the base and includes a component first side, a component second side opposite to the component first side, a first terminal on the component first side, and a second terminal on the component second side. The second terminal is coupled to the cavity side of the base. The base couples the second terminal to a first lead of the leads.

In an example, a method for manufacturing a semiconductor device comprises providing a substrate. The substrate comprises a base having a top side and a cavity side opposite to the top side, leads extending from the cavity side, and an encapsulant interposed between the leads. The method includes coupling an electronic component to the cavity side and spaced apart from the encapsulant.

Other examples are included in the present disclosure. Such examples may be found in the figures, in the claims, or in the description of the present disclosure.

Figure 1B:
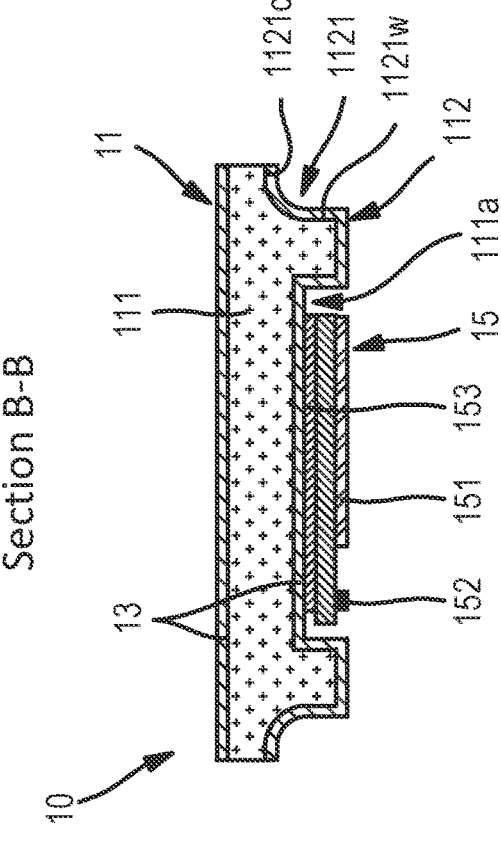
Figure 1B:
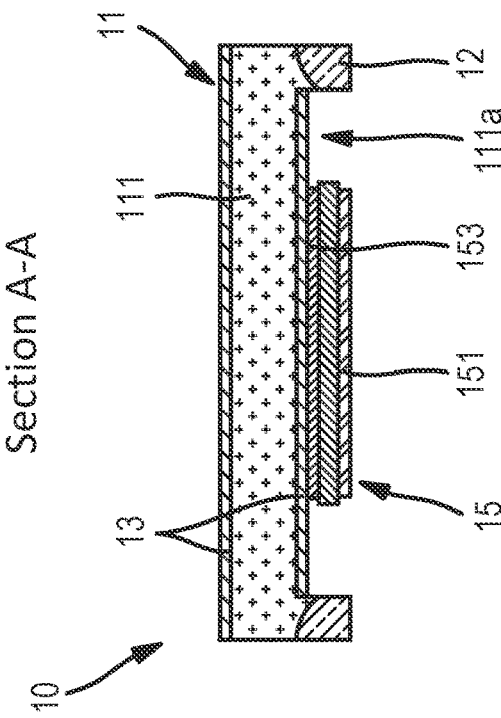

FIGS. 1A and 1B show top and bottom plan views and cross-sectional views, respectively, of an example electronic device 10. In the example shown in FIGS. 1A and 1B, electronic device 10 can comprise substrate 11, coating 13, encapsulant 12, and electronic component 15. The cross-sectional views of FIG. 1B are taken along Section A-A and Section B-B of the bottom plan view of FIG. 1A.

Substrate 11 can comprise base 111 and leads 112. Base 111 and leads 112 can define cavity 111a. Leads 112 can comprise lead flank 1121 with flank ceiling 1121c and flank sidewall 1121w. Electronic component 15 can comprise terminals 151, 152, and 153.

Substrate 11, encapsulant 12, and coating 13 can comprise or be referred to as an electronic package or a package. The electronic package can protect electronic component 15 from external elements or environmental exposure. The electronic package can provide coupling between electronic component 15 and external components or other electronic packages. FIGS. 2A to 2H show cross-sectional views of an example method for manufacturing an example electronic device 10 each with reference to Section A-A and Section B-B of the bottom plan view of FIG. 1A.

Figures 2A, 2B:
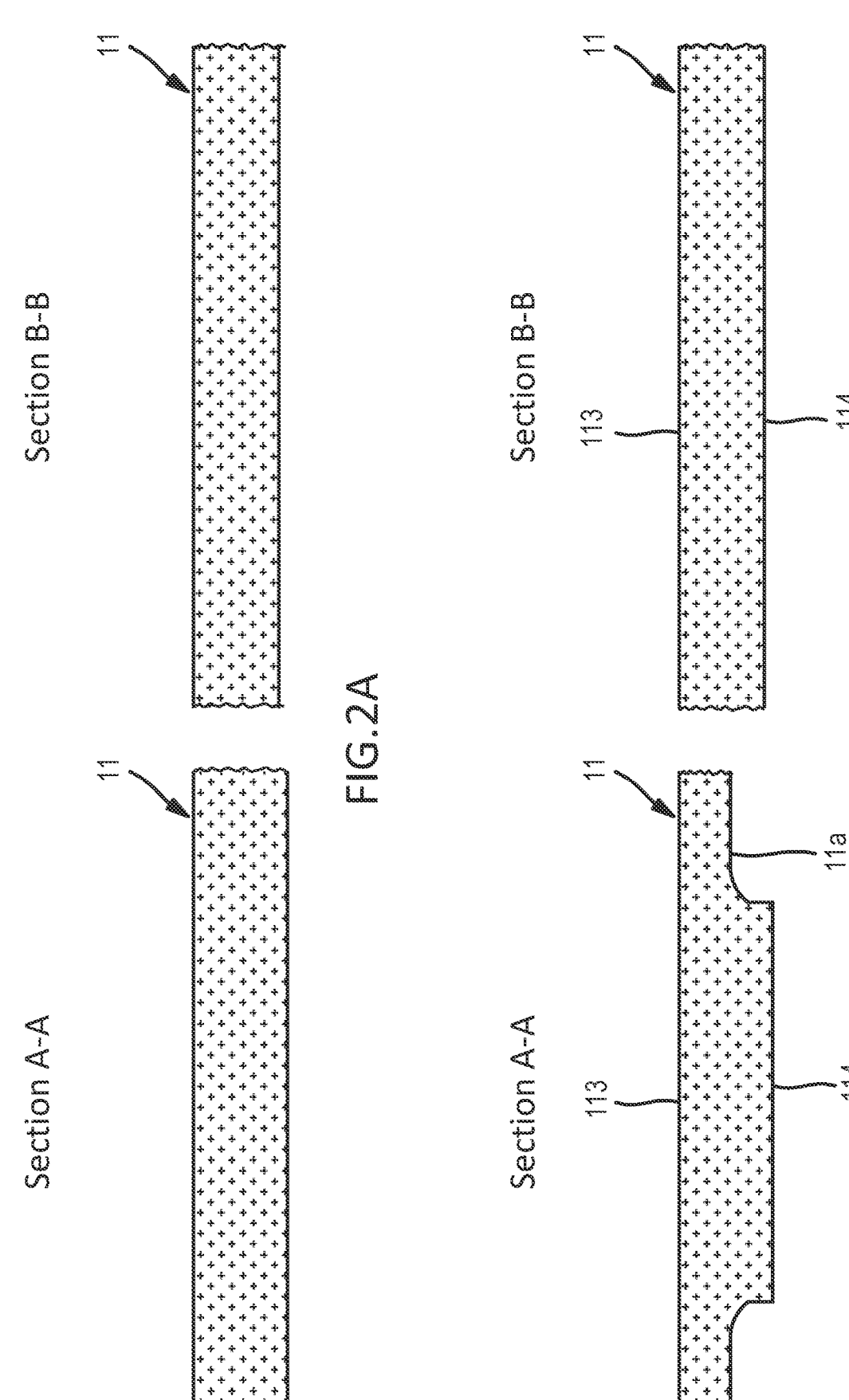
FIGS. 2A, 2B, 2C, 2D, 2E, 2F, 2G and 2H show cross-sectional views of an example method for manufacturing an example electronic device.

FIG. 2A shows a cross-sectional view of electronic device 10 at an early stage of manufacture. In the example shown in FIG. 2A, substrate 11 can be provided. In some examples, substrate 11 can comprise copper, a copper alloy, nickel, a nickel alloy, iron, or an iron-nickel alloy. In some examples, substrate 11 can be initially in the form of a large strip or plate or panel, such that a plurality of individual devices can be manufactured simultaneously, and then singulated into separate, individual devices from a single strip/plate/panel. In some examples, the thickness of substrate 11 can range from about 125 μm (micrometers) to about 250 μm. The thickness of substrate 11 is measured between upper (or first) side 113 of substrate 11 (FIG. 2B) and lower (or second) side 114 of substrate 11 (FIG. 2B). The thickness of substrate 11 can define the thickness of electronic device 10.

FIG. 2B shows a cross-sectional view of electronic device 10 at a later stage of manufacture. In the example shown in FIG. 2B, grooves 11a can be selectively provided in lower side 114 of substrate 11. In some examples, grooves 11a can be provided by partially etching lower side 114 of substrate 11. In some examples, grooves 11a can be provided by masking and dry etching, such as plasma etching, reactive ion etching (RIE), sputter-etching, or wet etching. In some examples, grooves 11a can be formed by stamping or punching into substrate 11. Grooves 11a can extend into substrate 11 and define separation between leads 112 (FIG. 1A) by removing respective portions of substrate 11 at opposite sides of each lead 112 (see FIG. 1A). In some examples, the depth of grooves 11a can range from about 30% to about 70% of the thickness of substrate 11.

Figures 2C, 2D:
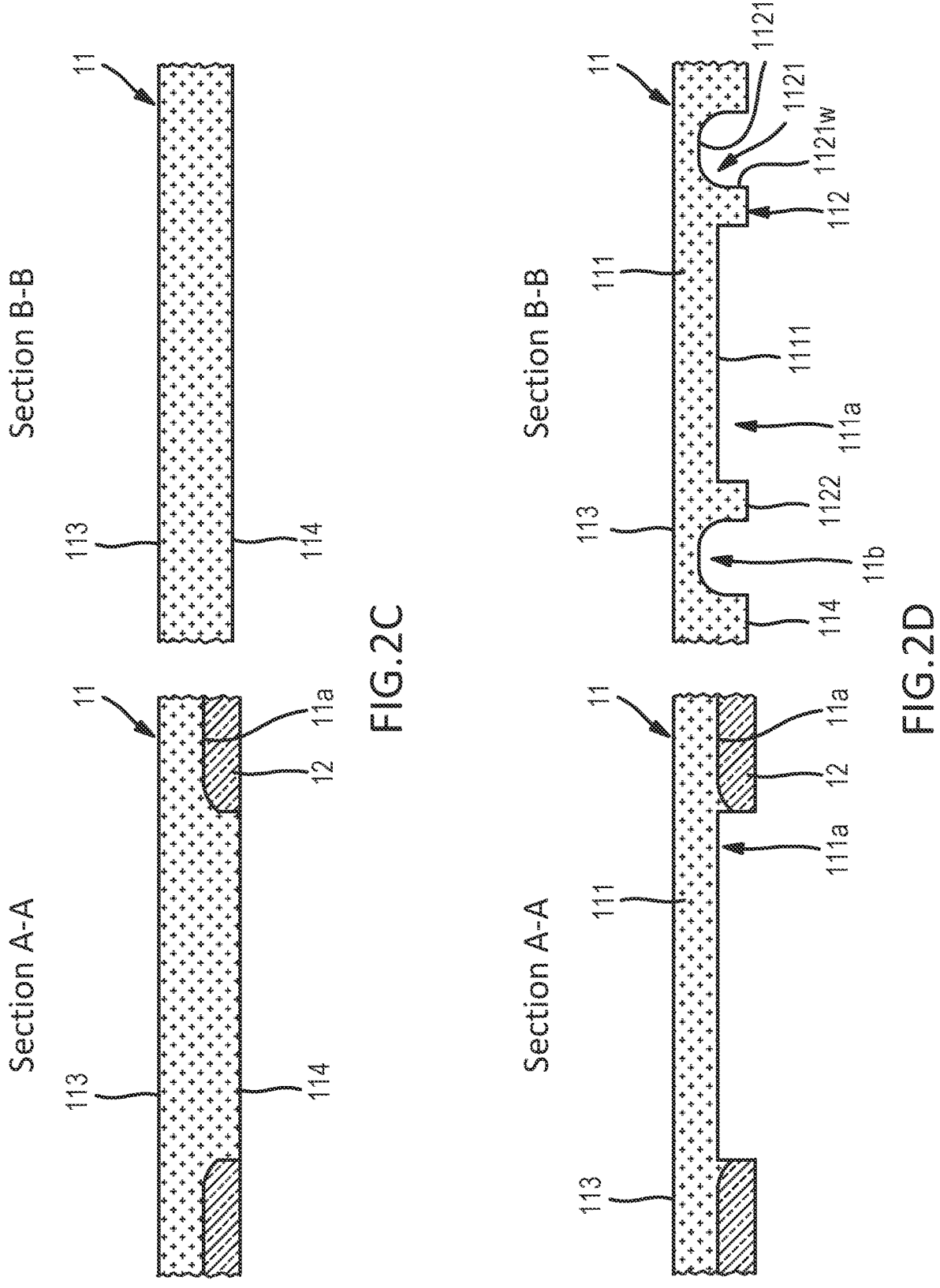

FIG. 2C shows a cross-sectional view of electronic device 10 at a later stage of manufacture. In the example shown in FIG. 2C, encapsulant 12 can be provided in grooves 11a. In some examples, encapsulant 12 can comprise or be referred to as a mold material, a protective material, an epoxy mold compound, or a resin, such as an organic resin with inorganic filler particles. In some examples, encapsulant 12 can comprise a polymer composite material, an epoxy resin, an epoxy resin with a filler, an epoxy acrylate with a filler, or a silicone resin. In some examples, encapsulant 12 can be provided by a compression molding process, transfer molding process, a film assisted molding process, a liquid phase encapsulant molding process, a vacuum lamination process, or a paste printing process. Encapsulant 12 can be provided in grooves 11a at lower side 114 of substrate 11, such that encapsulant 12 is interleaved or interposed between leads 112 (FIG. 1A). In some examples, the thickness of encapsulant 12 can range from about 87 μm to about 175 μm.

In some examples, the height (or thickness) of encapsulant 12 can be greater than the depth (or height) of grooves 11a. In this case, a grinding process or a chemical etching process can be performed to remove a portion of encapsulant 12. In some examples, lower side 114 of substrate 11 can be exposed from the lower side of encapsulant 12 by the grinding process. In some examples, lower side 114 of substrate 11 can be substantially coplanar with the lower side of encapsulant 12.

FIG. 2D shows a cross-sectional view of electronic device 10 at a later stage of manufacture. In the example shown in FIG. 2D, cavity 111a can be provided in lower side 114 of substrate 11. In some examples, cavity 111a can be provided by partially etching lower side 114 of substrate 11. Cavity 111a can extend inward from lower side 114 of substrate 11. In some examples, cavity 111a can be provided by dry etching, such as plasma etching, reactive ion etching (RIE), sputter-etching, or wet etching. In some examples, cavity 111a can be formed by stamping or punching substrate 11. Cavity 111a can provide a space in which electronic component 15 (FIG. 1B) can be mounted. The sidewall or perimeter of cavity 111a can be defined by the proximal (or inner) sidewalls of leads 112. In some examples, the depth of cavity 111a can range from about 30% to about 70% of the thickness of substrate 11. In some examples, encapsulant 12 does not have a uniform thickness across its width as illustrated in Section A-A of FIG. 2D. In some examples, the thickness of encapsulant 12 decreases proximal to cavity 111a.

With continuing reference to FIG. 2D, grooves 11b can be provided in lower side 114 of substrate 11. In some examples, grooves 11b can be provided by partially etching lower side 114 of substrate 11. In some examples, grooves 11b can be formed simultaneously with cavity 111a. The width of grooves 11b can be smaller than the width of cavity 111a. The depth of grooves 11b can be greater than the depth of cavity 111a. Grooves 11b can be provided outside the perimeter of cavity 111a. In some examples, grooves 11b can be provided along a boundary or singulation line 215 (FIG. 2F) of substrate 11. Grooves 11b can provide lead flanks 1121 of leads 112. In some examples, the width of grooves 11b can be smaller than the width of grooves 11a. In some examples, grooves 11b can be provided by masking and dry etching, such as plasma etching, reactive ion etching (RIE), sputter-etching, or wet etching. In some examples, grooves 11b can be defined by stamping or punching substrate 11. In some examples, the depth of grooves 11b can range from about 50% to about 70% of the thickness of substrate 11.

As shown in FIG. 2D, substrate 11 comprises base 111 and leads 112. Leads 112 can extend downward from cavity side 1111 of base 111 (i.e., leads 112 extend from base 111 away from upper surface 113). Cavity surface 1111, leads 112, and encapsulant 12 can define cavity 111a. In some examples, substrate 11 can comprise or be referred to as a lead frame, a pre-plated frame, a molded substrate, a molded lead frame, or a cavity substrate. In some examples, substrate 11 can radiate heat generated from electronic component 15 (FIG. 1B) outward.

In some examples, base 111 can comprise or be referred to as a paddle or a die pad. Cavity side 1111 of base 111 provides a floor of cavity 111a. The area (or "footprint") of cavity 111a can be sized to encompass the perimeter of electronic component 15. The depth of cavity 111a, as measured between bottom side 1122 of leads 12 and cavity side 1111 of base 111, can be similar to the height of electronic component 15. Lower side 114 of substrate 11 may provide bottom side 1122 of leads 112. Upper side 113 of substrate can also be referred to as a top side of base 111.

Leads 112 can be provided at the perimeter of base 111. In some examples, leads 112 can comprise or be referred to as legs or lead fingers. Leads 112 can provide an electrical connection path between substrate 11 and an external component. With momentary reference to FIG. 1A, each lead 112 can include a proximal side oriented toward electronic component 15, a distal side opposite to the proximal side, a first lateral side extending from the proximal side to the distal side, and a second lateral side opposite to the first lateral side and extending from the proximal side to the distal side. The distal side is oriented away from electronic device 15 and may form flank wall 1121 (FIG. 1B). The first and second lateral sides are each oriented towards encapsulant 12. In some examples, encapsulant 12 may be recessed with respect to the proximal side of leads 12 (bottom plan view of FIG. 1A). For example, the surface of encapsulant 12 that is oriented toward electronic component 15 may be a greater distance from electronic component 15 than the proximal sidewall of leads 112.

Returning to FIG. 2D, the proximal side of leads 112 can comprise or define at least a portion of cavity 111a, the first and second lateral sides of leads 112 can comprise or define at least a portion grooves 11a, and the distal side of leads 112 can define, at least, a portion of grooves 11b. In some examples, one or more of leads 112 can comprise lead flank 1121. In some examples, lead flank 1121 can comprise or be referred to as a wettable flank. Lead flank 1121 can be exposed at an external lateral side of substrate 11. In some examples, lead flank 1121 can provide a space that can be filled by an interface material (e.g., solder) when electronic device 10 is attached or connected to an external component. Lead flank 1121 can comprise flank ceiling 1121c and flank sidewall 1121w. In some examples, flank ceiling 1121c can be substantially parallel to upper side 113 of substrate 11, and flank sidewall 1121w can be substantially perpendicular to the cavity wall 1111 or upper side 113 of substrate 11.

Figures 2E, 2F:
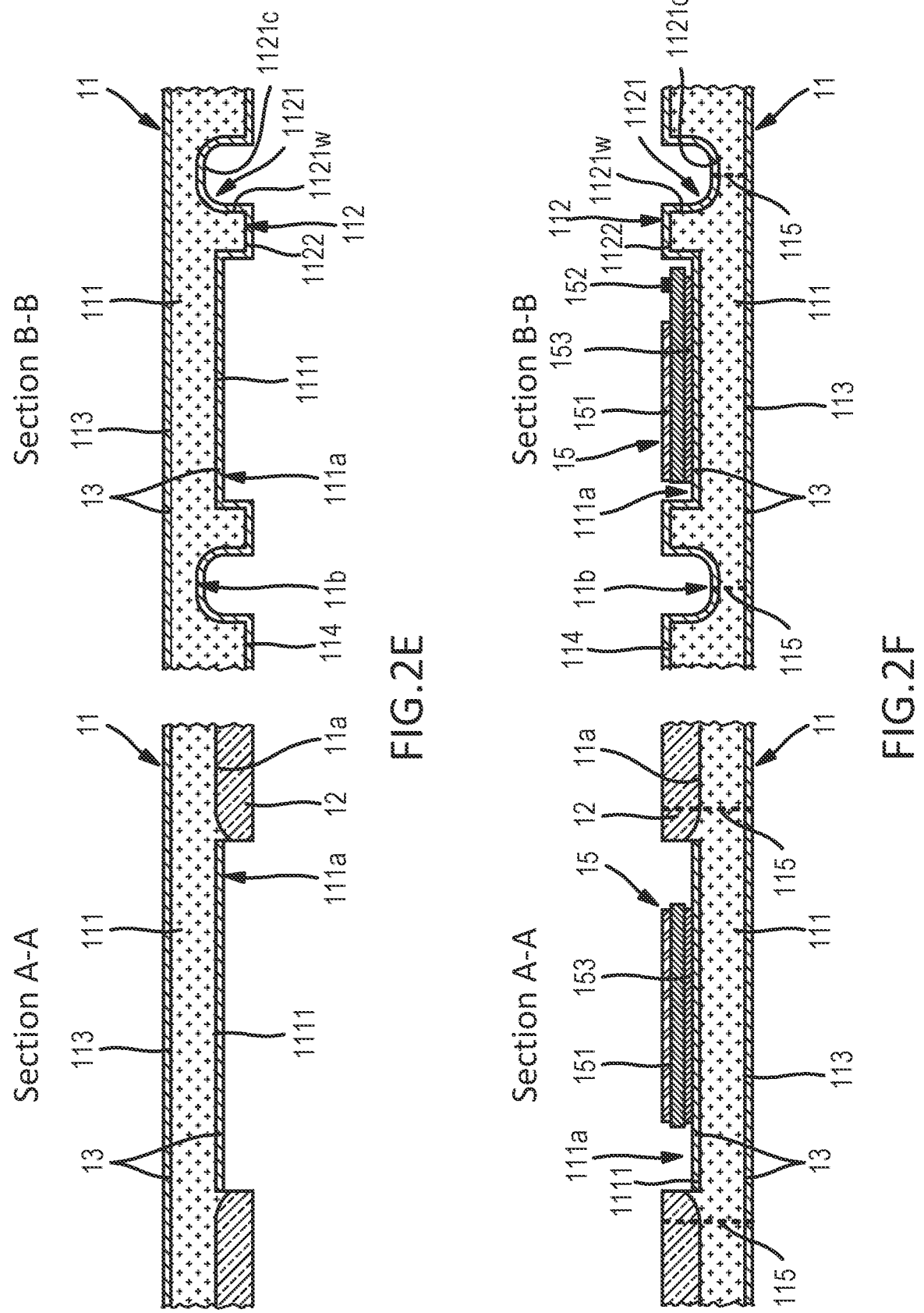

FIG. 2E shows a cross-sectional view of electronic device 10 at a later stage of manufacture. In the example shown in FIG. 2E, coating 13 can be provided on upper side 113 and lower side 114 of substrate 11. Coating 13 can be provided on the surfaces of base 111 (or cavity 111a) and leads 112 (or lead flank 1121). In some examples, coating 13 can comprise or be referred to as a conductive coating or plating. In some examples, coating 13 can comprise an electrically conductive material, such as gold, silver, copper, platinum, tin, nickel, palladium, titanium, or tungsten. In some examples, coating 13 can be provided by electroless plating or electrolytic plating. In some examples, coating 13 can provide an electrical interface between substrate 11 and electronic component 15 (FIG. 2F), or between substrate 11 and an external component. In some examples, the thickness of coating 13 can range from about 1.25 μm to about 8 μm.

FIG. 2F shows a cross-sectional view of electronic device 10 at a later stage of manufacture. In the example shown in FIG. 2F, electronic component 15 can be provided in cavity 111a. FIG. 2F also illustrates saw streets 115 where substrate 11 and encapsulant 12 can be singulated in subsequent processing as described later. Electronic component 15 can be located on cavity side 1111 of base 111. In some examples, substrate 11 can be flipped, and cavity 111a can face upward. In some examples, electronic component 15 can be coupled to coating 13 via an interface material. For example, the interface material can be provided on coating 13, electronic component 15 can be seated on the interface material, and then electronic component 15 can be coupled to coating 13 on cavity side 1111 by thermal curing or sintering. In some examples, the interface material can comprise solder, a conductive adhesive, or a thermal interface material. Electronic component 15 can comprise a component first side with terminals 151 and 152 and a component second side with terminal 153. Electronic component 15 can be coupled to base 111 such that terminal 153 is coupled to coating 13. Terminal 153 can be coupled to leads 112 through base 111. In some examples, terminals 151 and 152 of electronic component 15 can be oriented away from cavity side 1111 of base 111 and towards the outer opening of cavity 111a. That is, terminals 151 and 152 are distal to cavity side 1111.

In some examples, electronic component 15 can comprise or be referred to as one or more dies, chips, or packages. In some examples, electronic component 15 can comprise a semiconductor package, such as a semiconductor die, a semiconductor chip, or a chip scale package. In some examples, electronic component 15 can comprise a power device or a field-effect transistor (FET) device. In some examples, the height of electronic component 15 can be similar to the depth of cavity 111a. In some examples, terminals 151 or 152 can be substantially coplanar with leads 112. For example, terminals 151 or 152 can be substantially coplanar with coating 13 on bottom side 1122 of leads 112.

In some examples, terminals 151, 152, and 153 can comprise or be referred to as pads, bond pads, lands, a wiring layer, or a metal layer. In some examples, terminal 151 can be referred to as a current carrying terminal, a source, or a source terminal; terminal 152 can be referred to as a control terminal, a gate, or a gate terminal; and terminal 153 can be referred to as a current carrying terminal, a drain, or a drain terminal. In some examples, terminal 153 can be a first current carrying terminal and terminal 151 can be a second current carrying terminal. Terminals 151, 152, and 153 can comprise an electrically conductive material, such as copper, aluminum, palladium, titanium, tungsten, titanium/tungsten, nickel, gold, or silver. In some examples, terminals 151, 152, and 153 can be provided as a connection path between electronic component 15 and substrate 11 or between electronic component 15 and an external component. In some examples, the thickness of terminals 151, 152, and 153 can range from about 4 μm to about 10 μm.

Figures 2G, 2H:
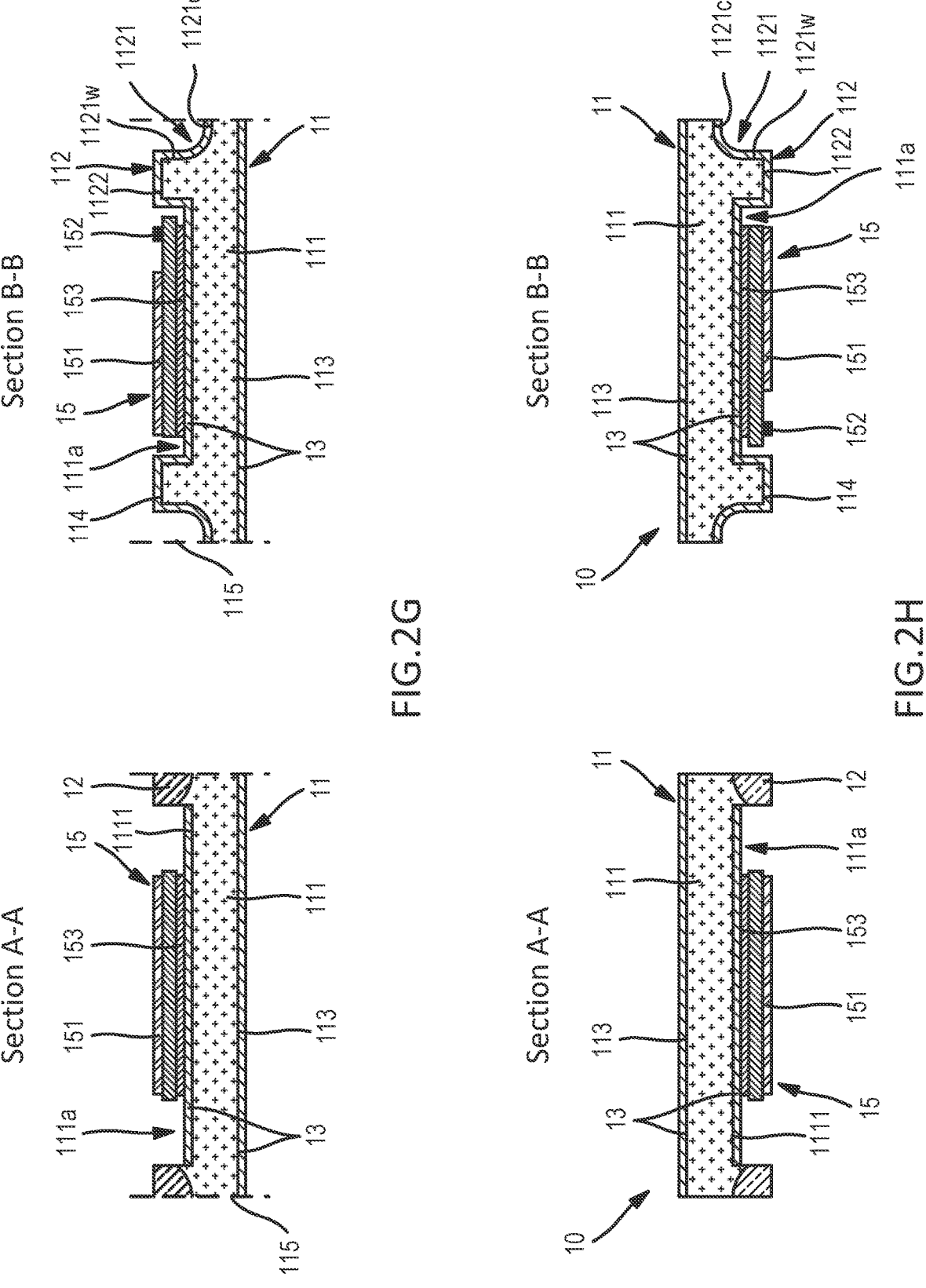

FIG. 2G shows a cross-sectional view of electronic device 10 at a later stage of manufacture. In the example shown in FIG. 2G, a singulation process can be carried out. In some examples, the singulation process can use a sawing tool, such as a diamond blade or a laser beam, to separate individual substrates 11 from each other. The sawing tool can cut along saw streets 115 to singulate substrate 11. In some examples, at least, some of the saw streets 115 may be located under grooves 11a and 11b. Lead flank 1121 can be exposed at the lateral side of substrate 11. The sawing tool can cut through encapsulant 12 and substrate 11 simultaneously.

In the example shown in FIG. 2H, substrate 11 can be flipped, and electronic device 10 having electronic component 15 exposed at lower side 114 of substrate 11 can be provided. Terminals 151 and 152 of electronic component 15 can be exposed at the bottom side of electronic device 10 (e.g., at lower side 114 of substrate 11 and bottom side 1122 of leads 12). Terminals 151 and 152 can be substantially coplanar with leads 112 or substantially coplanar with coating 13 on bottom sides 1122 of leads 112. In the present example, encapsulant 12 can be exposed at least along opposing sides of base 111 as viewed from the top side of base 111 as illustrated in FIG. 1A. That is, the top side of base 111, which is opposite to cavity 111a, is bounded on at least two sides by encapsulant 12. As viewed from the bottom side of electronic device 10, encapsulant 12 includes two continuous segments bounding cavity 111a on opposite sides and two discontinuous segments bounding cavity 111a between leads 112 on opposite sides as illustrated in FIG. 1B. The two continuous segments are exposed at the top side of base 111 as illustrated in FIG. 1A. In some examples, leads 112 are integral with base 111 in that they are formed from the same work piece. The lateral sides of electronic component 15 can be exposed (e.g., free from or devoid of encapsulant). For example, electronic component 15 is spaced apart from encapsulant 12 and the area/volume between electronic component 15 and the proximal sides of leads 12 (i.e., the sides oriented toward electronic component 15) is devoid of material. The exposed lateral sides of electronic component 15 tend to allow for better cooling and improved thermal performance.

Figure 3A:
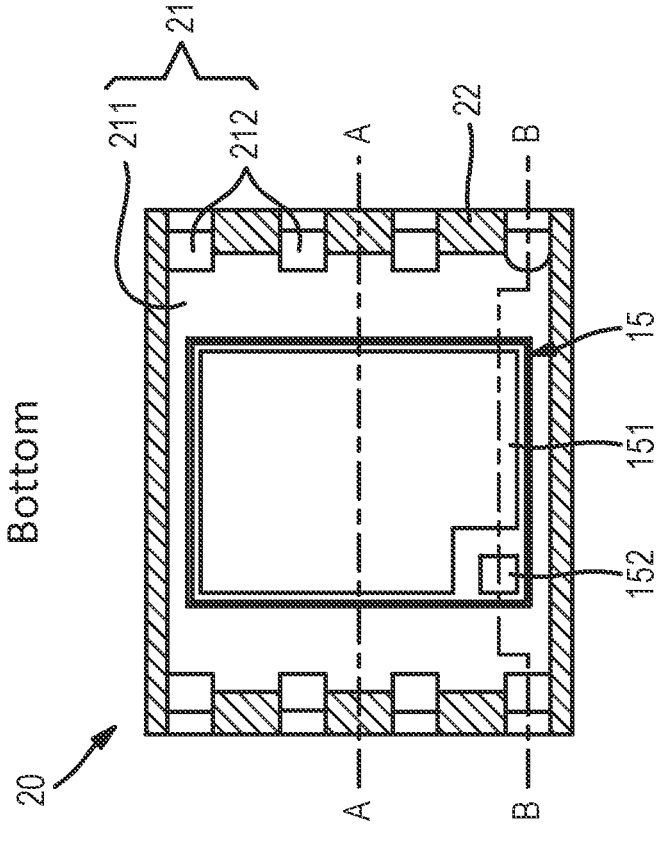
FIGS. 3A and 3B show plan views and cross-sectional views, respectively, of an example electronic device.
Figure 3A:
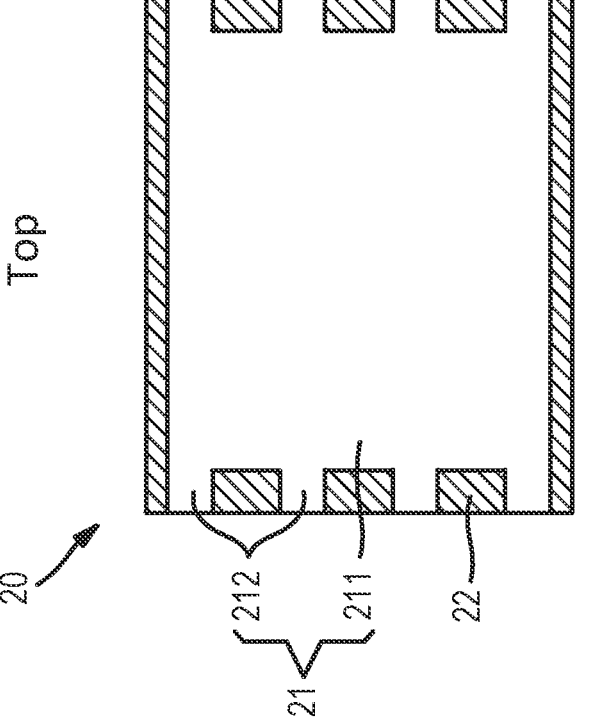
Figure 3B:
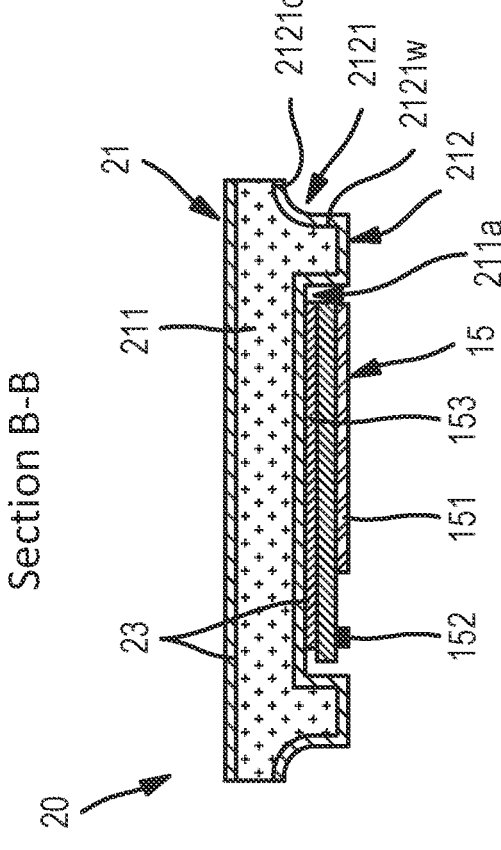
Figure 3B:
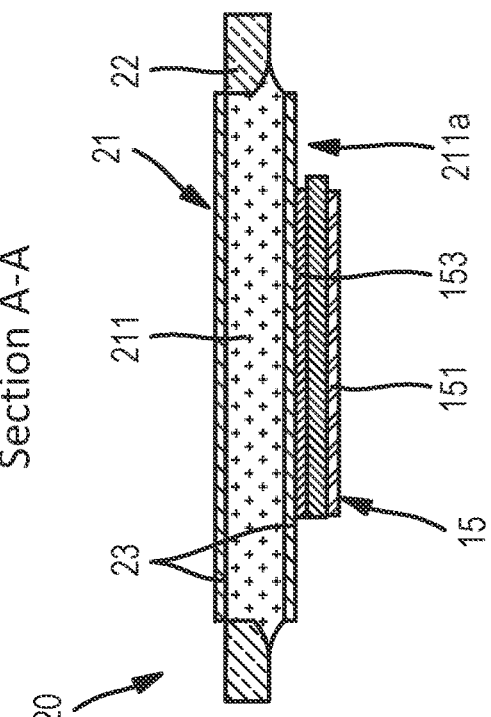

FIGS. 3A and 3B show top and bottom plan views and cross-sectional views, respectively, of an example electronic device 20. In the example shown in FIGS. 3A and 3B, electronic device 20 can comprise substrate 21, encapsulant 22, coating 23, and electronic component 15. The cross-sectional views of FIG. 3B are taken along Section A-A and Section B-B of the bottom plan view of FIG. 3A. Features, elements, structures, or manufacturing steps for electronic device 20 can be similar to those of electronic device 10, as described above with reference to FIGS. 1A and 1B and FIGS. 2A to 2H.

Substrate 21 can comprise base 211 and leads 212. Base 211 can comprise cavity 211a. Leads 212 can comprise lead flank 2121. Lead flank 2121 can comprise flank ceiling 2121c and flank sidewall 2121w.

Substrate 21, encapsulant 22, and coating 23 can comprise or be referred to as an electronic package or a package. The electronic package can protect electronic component 15 from external elements or environmental exposure. The electronic package can provide coupling between electronic component 15 and external components or other electronic packages.

FIGS. 4A to 4I show cross-sectional views of an example method for manufacturing an example electronic device 20 each with reference to Section A-A and Section B-B of the bottom plan view of FIG. 3A.

Figures 4A, 4B, 4C:
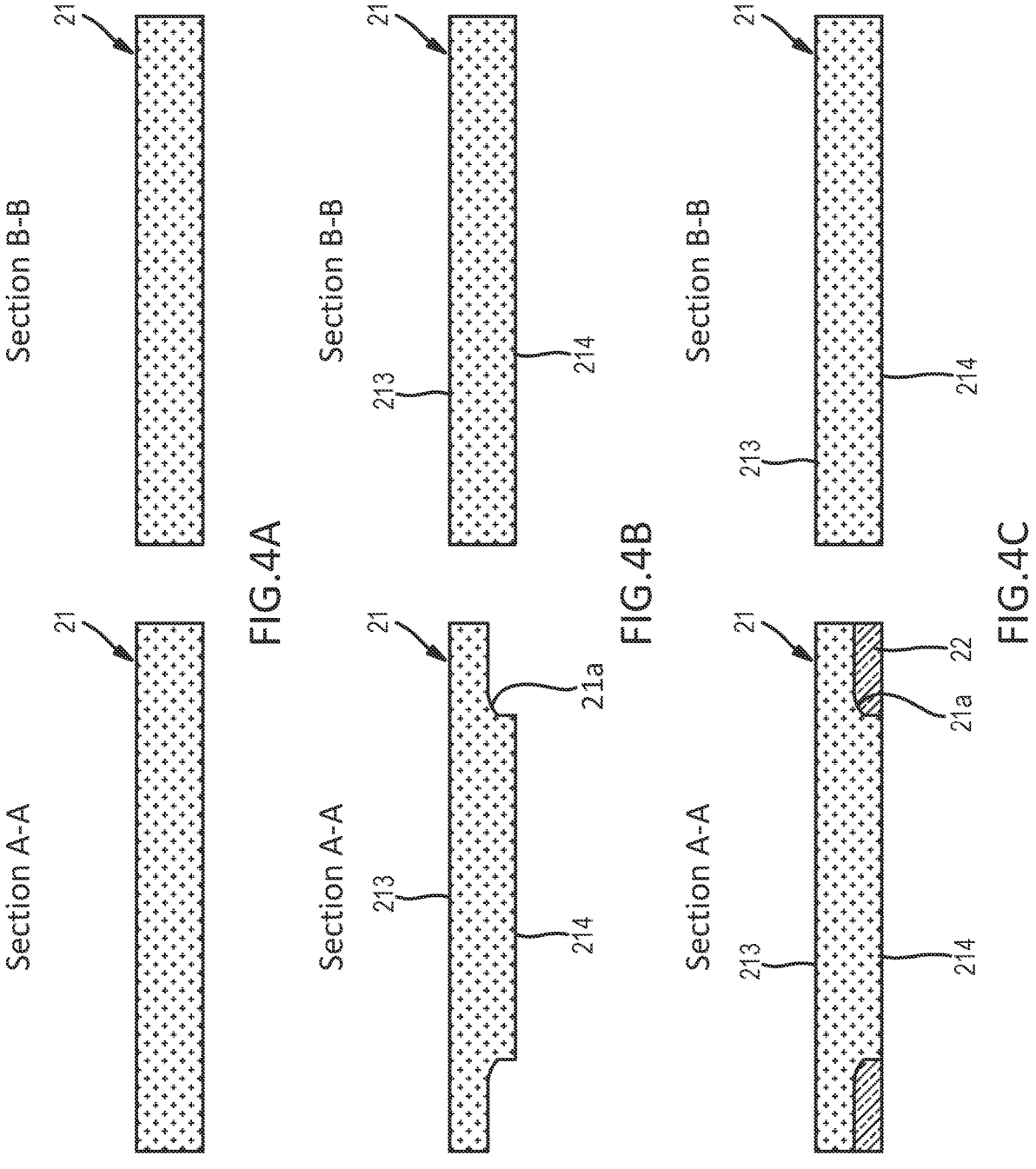
FIGS. 4A, 4B, 4C, 4D, 4E, 4F, 4G, 4H, and 4I show cross-sectional views of an example method for manufacturing an example electronic device.

FIG. 4A shows a cross-sectional view of electronic device 20 at an early stage of manufacture. In the example shown in FIG. 4A, substrate 21 can be provided. In some examples, substrate 21 can comprise similar elements, features, materials, or formation processes to those of substrate 11 previously described.

FIG. 4B shows a cross-sectional view of electronic device 20 at a later stage of manufacture. Substrate 211 can comprise an upper (or first) side 213 and a lower (or second) side 214. In the example shown in FIG. 4B, grooves 21a can be selectively provided in lower side 214 of substrate 21. In some examples, groove 21a can comprise similar elements, features, materials, or formation processes to those of groove 11a previously described. Grooves 21a can extend into substrate 11 to define leads 212. Grooves 21a can be formed by removing a respective portion of substrate 21 at opposite sides of leads 212 (see FIG. 3A).

FIG. 4C shows a cross-sectional view of electronic device 20 at a later stage of manufacture. In the example shown in FIG. 4C, encapsulant 22 can be provided in grooves 21a. In some examples, encapsulant 22 can comprise similar elements, features, materials, or formation processes to those of encapsulant 12 previously described. The lower side 214 of substrate 21 can be substantially coplanar with the bottom side of encapsulant 22.

Figures 4D, 4E:
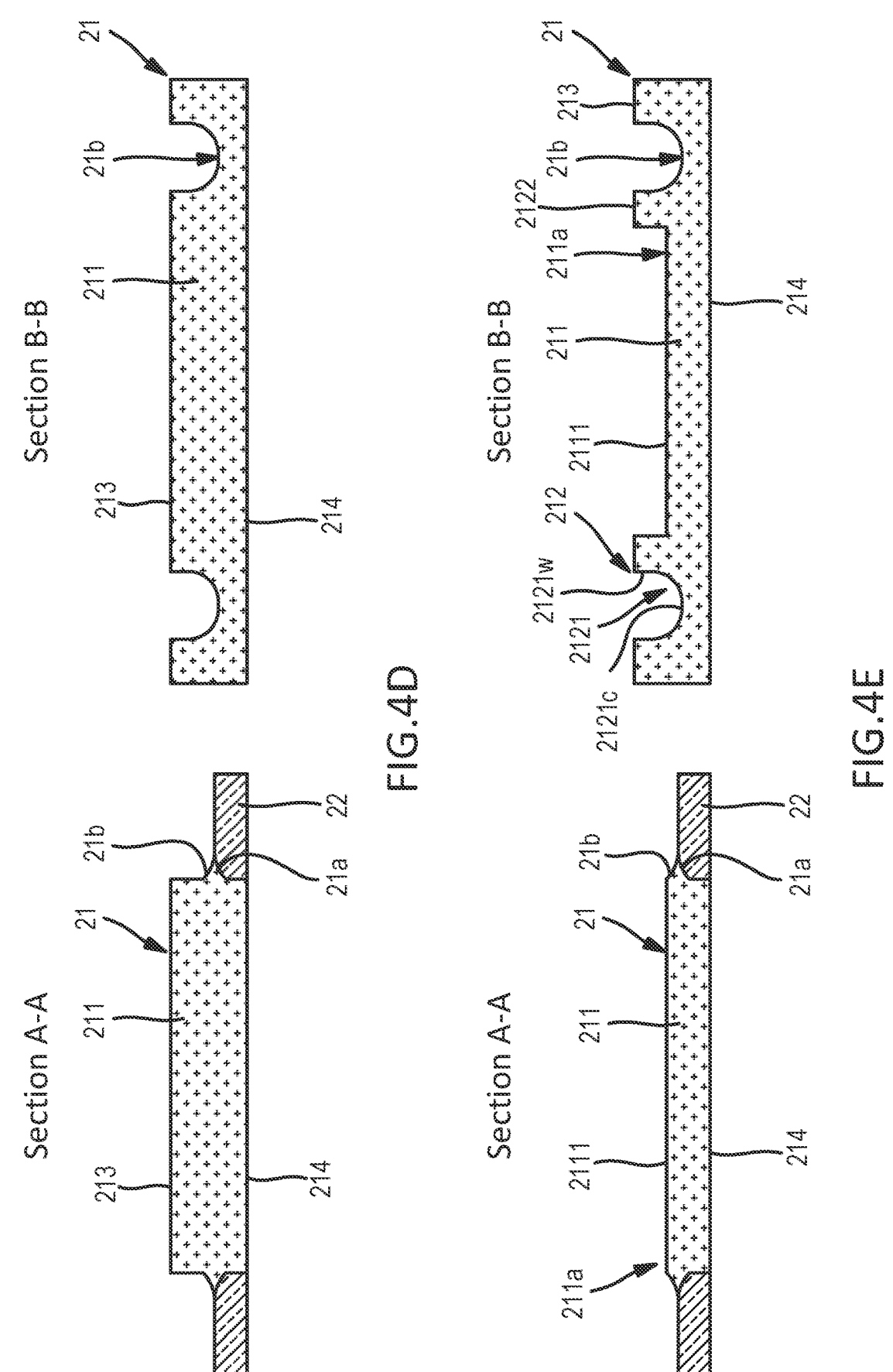

FIG. 4D shows a cross-sectional view of electronic device 20 at a later stage of manufacture. In the example shown in FIG. 4D, grooves 21b can be selectively provided in upper side 213 of substrate 21. In some examples, grooves 21b can comprise similar elements, features, materials, or formation processes to those of grooves 11b previously described. In some examples, grooves 21b can be provided by masking and partially etching upper side 213 of substrate 21. Grooves 21a and 21b can be provided in opposite sides of substrate 21. In some examples, grooves 21b can be vertically aligned with grooves 21a. Grooves 21b can extend to and expose encapsulant 22. Encapsulant 22 can be exposed at the upper and lower sides 213, 214 of substrate 21 by grooves 21a and 21b. In some examples, grooves 21a and 21b meet at an edge that extends outward from substrate 21. That is, grooves 21a and 21b form a pointed edge portion for substrate 21. Encapsulant 22 can terminate adjacent to the pointed edge portion as generally illustrated in Section A-A of FIG. 4D. The pointed edge portion of substrate 21 may also be referred to as a non-planar edge portion, a tapered edge portion, a rotated V-shaped edge portion, or a beak-shaped edge portion. In some examples, groove 21b is free from or devoid of encapsulant 22.

FIG. 4E shows a cross-sectional view of electronic device 20 at a later stage of manufacture. In the example shown in FIG. 4E, cavity 211a can be provided in upper side 213 of substrate 21. In some examples, cavity 211a can comprise similar elements, features, materials, or formation processes to those of cavity 111a previously described. In some examples, cavity 211a can be provided by masking and partially etching upper side 213 of substrate 21. Cavity 211a can be formed inwardly from upper side 213 of substrate 21. Cavity 211a can be provided within a perimeter of grooves 21b. In some examples, cavity 211a can be connected to grooves 21b. The proximal sidewall of leads 212 can define, at least a portion, of a perimeter or sidewall of cavity 211a.

In some examples, base 211 and leads 212 can comprise similar elements, features, materials, or formation processes to those of base 111 and leads 112, respectively, as previously described. For example, leads 212 comprise lead flank 2121, which can be similar to lead flank 1121 of leads 112. Leads 212 comprise bottom side 2122, which may be formed by upper side 213 of substrate 21. Lead flank 2121 comprises flank ceiling 2121c and flank sidewall 2121w, which can be correspondingly similar to flank ceiling 1121c and flank sidewall 1121w, respectively, of lead flank 1121. Base 211 may comprise cavity side 2111 and a top side opposite cavity side 2111. The top side of base 211 may be formed by lower side 214 of substrate 21. Leads 212 may extend from cavity side 2111.

Figures 4F, 4G:
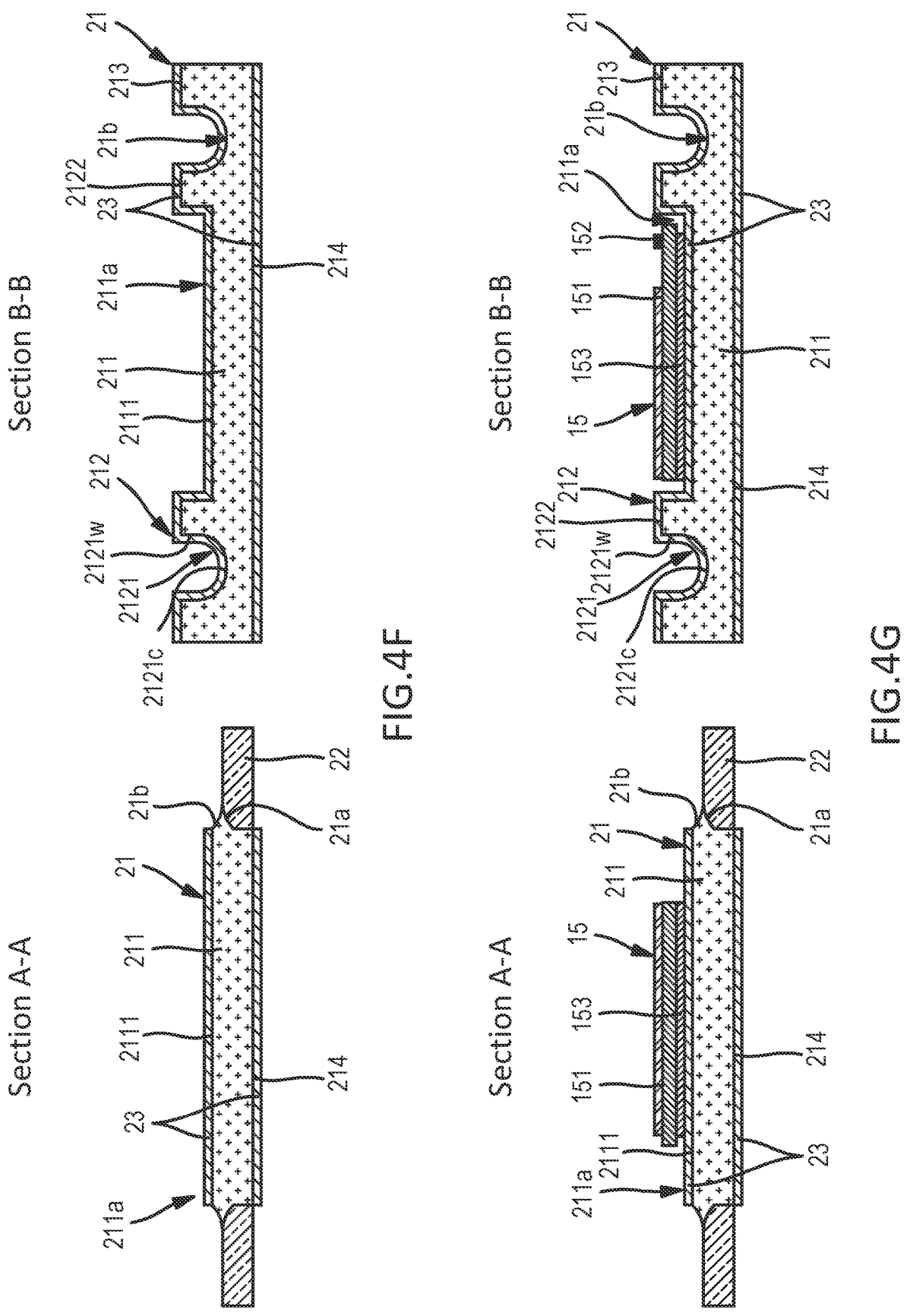

FIG. 4F shows a cross-sectional view of electronic device 20 at a later stage of manufacture. In the example shown in FIG. 4F, coating 23 can be provided on upper side 213 and lower side 214 of substrate 21. Coating 23 can be provided on the surfaces of base 211 (or cavity 211a) and leads 212 (or lead flank 2121). In some examples, coating 23 can comprise similar elements, features, materials, or formation processes to those of coating 13 previously described. Although not illustrated in Section A-A of FIG. 4F, in some examples, coating 23 can extend over groove 21b.

FIG. 4G shows a cross-sectional view of electronic device 20 at a later stage of manufacture. In the example shown in FIG. 4G, electronic component 15 can be provided in cavity 211a of base 211. Electronic component 15 can be located on cavity side 2111 of base 211. In some examples, electronic component 15 can be coupled to coating 23 on cavity side 2111 similar to electronic component 15 in cavity 111a of base 111 (FIG. 2F). In some examples, electronic component 15 can be coupled to base 211 such that terminal 153 is coupled to coating 23. Terminal 153 can be coupled to leads 212 through base 211. Terminals 151 and 152 of electronic component 15 can remain exposed from cavity 211*a* (e.g., terminals 151 and 152 can be oriented away from or distal to the floor of cavity 211*a* and facing the outer opening of cavity 211*a*).

Figures 4H, 4I:
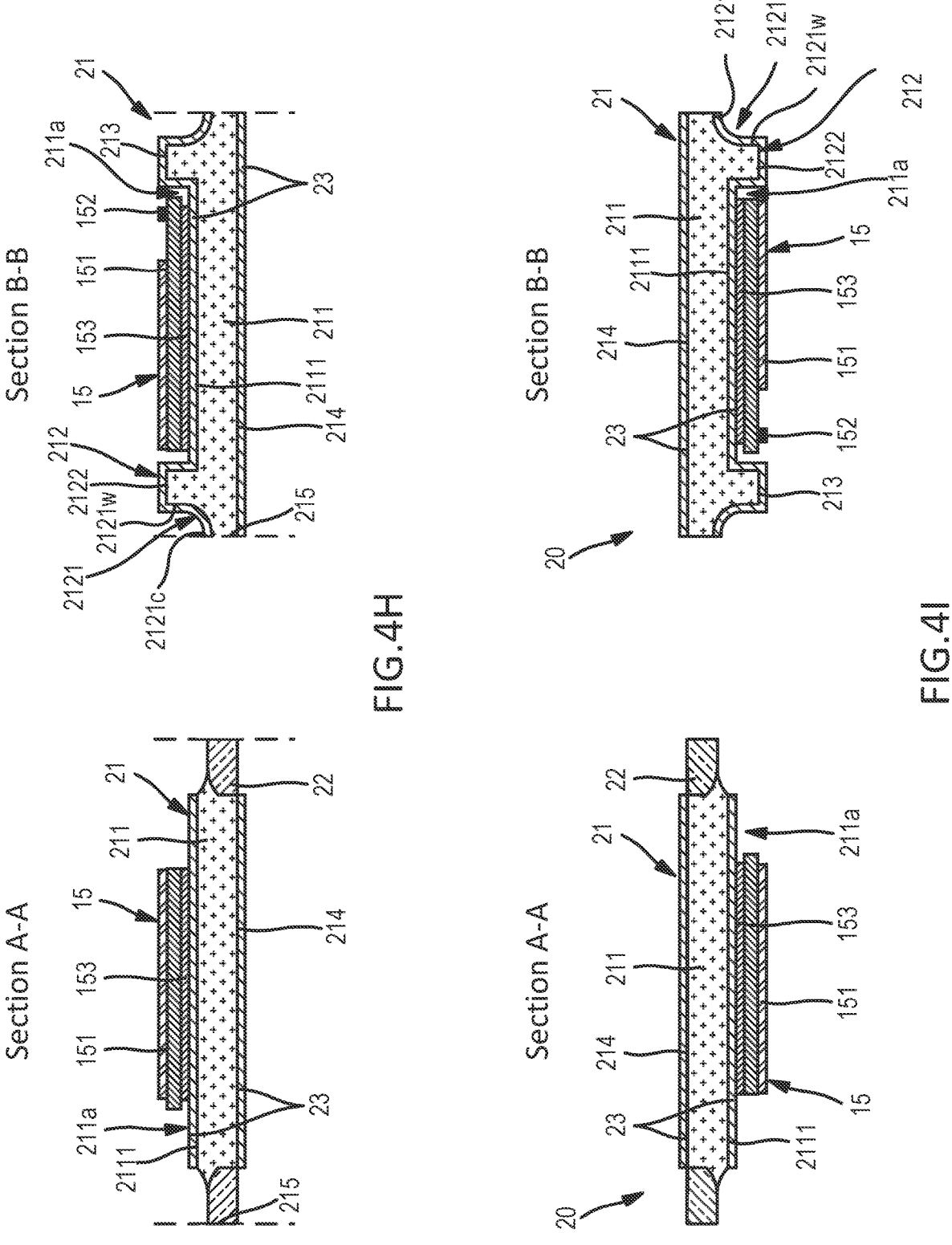

FIG. 4H shows a cross-sectional view of electronic device 20 at a later stage of manufacture. In the example shown in FIG. 4H, a singulation process can be carried out. In some examples, the singulation process can use a sawing tool, such as a diamond blade, or a laser beam, to separate individual substrates 21 from each other. The sawing tool can cut through saw lines 215, which can be located under (e.g., aligned with) grooves 21*b*, to singulate substrate 21. Lead flank 2121 can be exposed at the lateral side of substrate 21. The sawing tool can cut through encapsulant 22 and substrate 21 simultaneously.

In the example shown in FIG. 4I, substrate 21 can be flipped, and electronic device 20 having electronic component 15 exposed at the bottom side of electronic device 20 can be provided. Terminals 151 and 152 of electronic component 15 can be exposed at the bottom side of electronic device 20 (face-down). Terminals 151 and 152 can be substantially coplanar with leads 212 or substantially coplanar with coating 23 on the bottom sides 2122 of leads 212. In the present example, encapsulant 22 can be exposed along each side of base 211 as viewed from the top side of base 211 as illustrated in FIG. 3A. That is, the top side of base 211, which is opposite to cavity 211*a*, is bounded on each side by encapsulant 22. As viewed from the bottom side of electronic device 20, encapsulant 22 includes two continuous segments bounding cavity 211*a* on opposite sides and two discontinuous segments bounding cavity 211*a* between leads 212 on opposite sides as illustrated in FIG. 3B. The two continuous segments and the two discontinuous segments are exposed at the top side of base 211 as illustrated in FIG. 3A. In some examples, leads 212 are integral with base 211 in that they are formed from the same work piece.

Figure 5A:
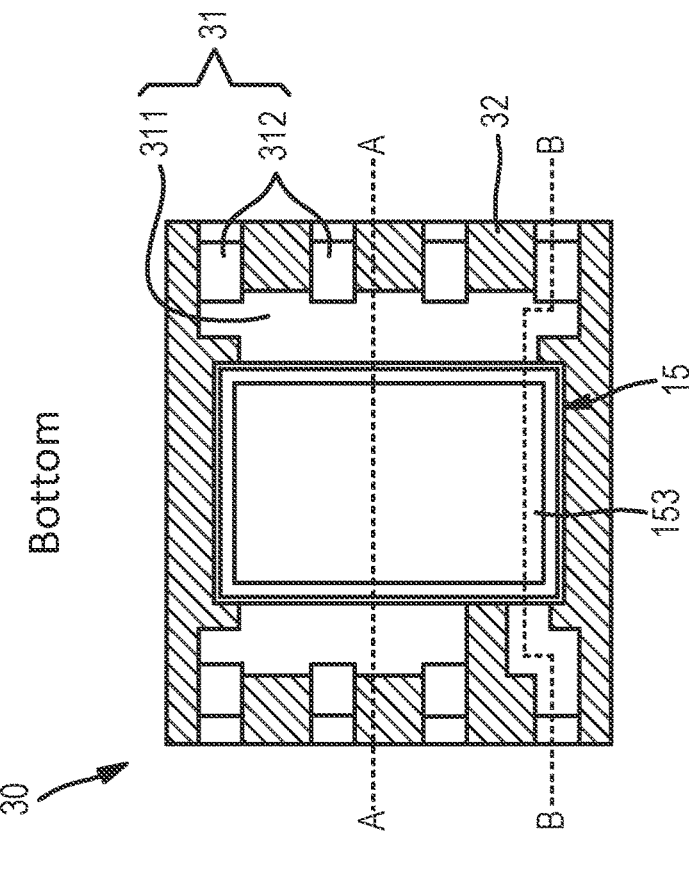
FIGS. 5A and 5B show plan views and cross-sectional views, respectively, of an example electronic device.
Figure 5A:
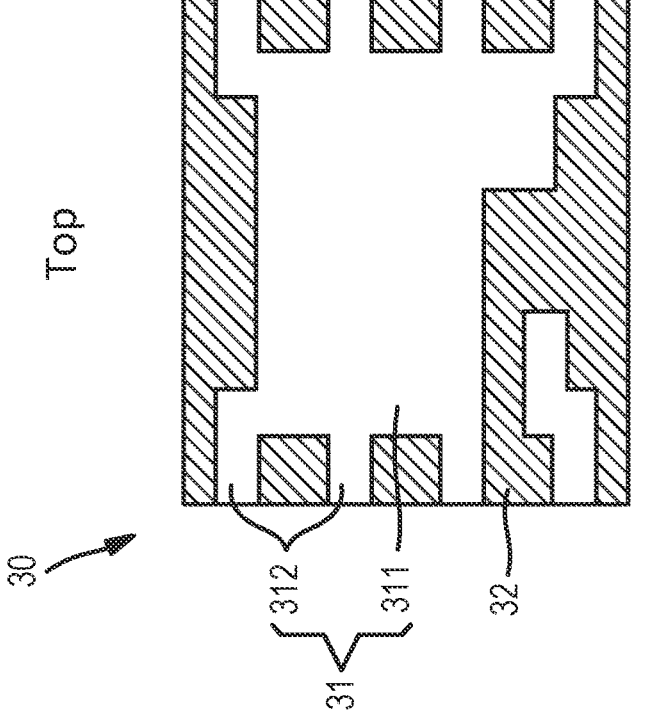
Figure 5B:
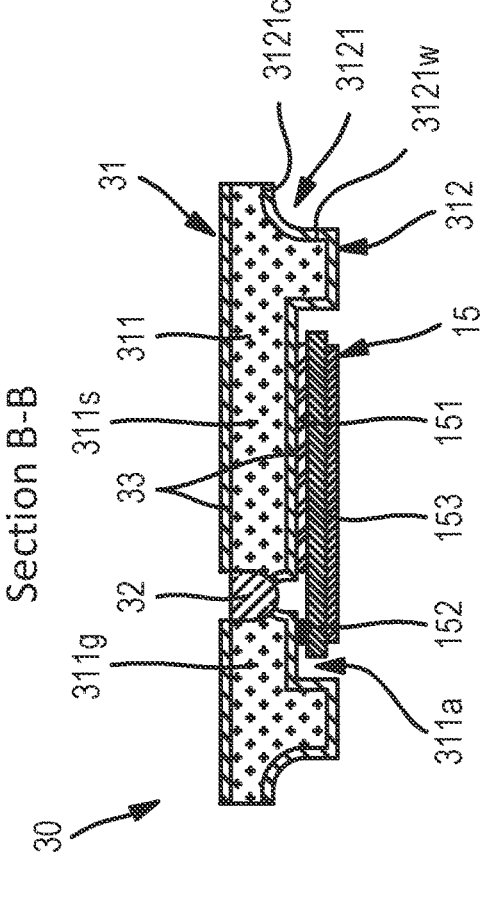
Figure 5B:
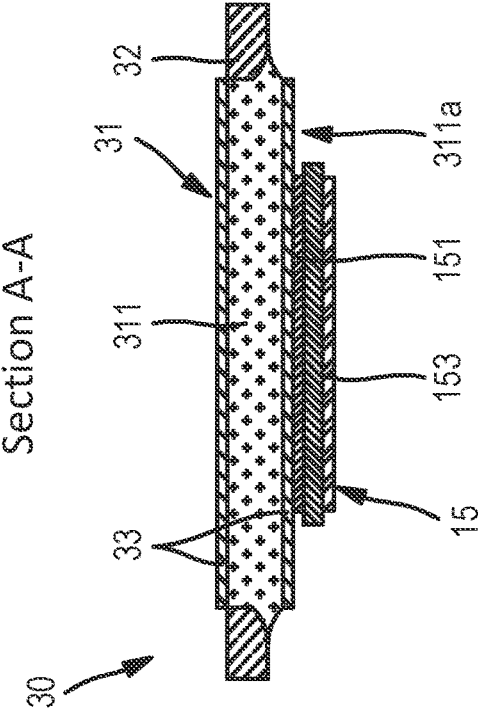

FIGS. 5A and 5B show top and bottom plan views and cross-sectional views, respectively, of an example electronic device 30. In the example shown in FIGS. 5A and 5B, electronic device 30 can comprise substrate 31, encapsulant 32, coating 33, and electronic component 15. The cross-sectional views of FIG. 5B are taken along Section A-A and Section B-B of the bottom plan view of FIG. 5A. Features, elements, structures, or manufacturing steps for electronic device 30 can be similar to those of electronic device 10, as described with respect to FIGS. 1A to 1B and FIGS. 2A to 2H or to those of electronic device 20, as described with respect to FIGS. 3A to 3B and FIGS. 4A to 4I.

Substrate 31 can comprise base 311 and leads 312. Base 311 can comprise cavity 311*a*. Leads 312 can comprise lead flank 3121. Lead flank 3121 can comprise flank ceiling 3121*c* and flank sidewall 3121*w*.

Substrate 31, encapsulant 32, and coating 33 can comprise or be referred to as an electronic package or a package. The electronic package can protect electronic component 15 from external elements or environmental exposure. The electronic package can provide coupling between electronic component 15 and external components or other electronic packages.

FIGS. 6A to 6I show cross-sectional views of an example method for manufacturing an example electronic device 30 each with reference to Section A-A and Section B-B of the bottom plan view of FIG. 5A.

Figures 6A, 6B, 6C:
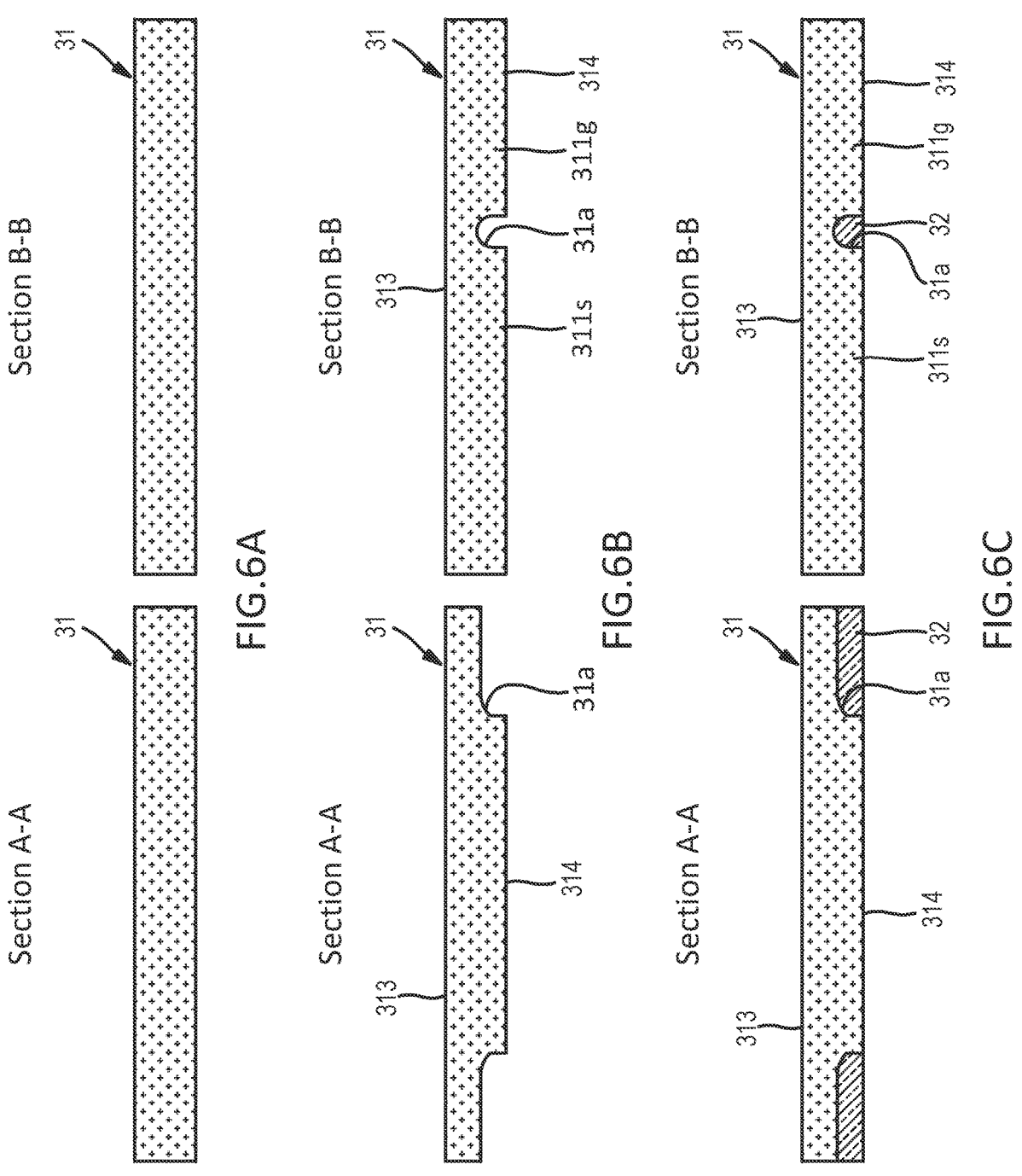
FIGS. 6A, 6B, 6C, 6D, 6E, 6F, 6G, 6H, and 6I show cross-sectional views of an example method for manufacturing an example electronic device.

FIG. 6A shows a cross-sectional view of electronic device 30 at an early stage of manufacture. In the example shown in FIG. 6A, substrate 31 can be provided. In some examples, substrate 31 can comprise similar elements, features, materials, or formation processes to those of substrate 11 previously described.

FIG. 6B shows a cross-sectional view of electronic device 30 at a later stage of manufacture. Substrate 31 can include an upper (or first) side 313 and a lower (or second) side 314. In the example shown in FIG. 6B, grooves 31*a* can be provided in lower side 314 of substrate 31. In some examples, grooves 31*a* can comprise similar elements, features, materials, or formation processes to those of grooves 11*a* previously described. In some examples, a portion of substrate 31 can be removed by etching, for example, to form grooves 31*a*. Grooves 31*a* can be provided as a line or a pattern to separate portions of base 311 from each other. For example, grooves 31*a* can separate base 311 into segment or portion 311*g* for coupling with terminal 152 (FIG. 5B) of electronic component 15, and segment or portion 311*s* for coupling with terminal 151 (FIG. 5B) of electronic component 15. In some examples, portion 311*g* can comprise of be referred to as a trace, and portion 311*s* can comprise or be referred to as a paddle, die pad, or a trace. As described in further detail below, portion 311*g* may be electrically isolated from portion 311*s*.

FIG. 6C shows a cross-sectional view of electronic device 30 at a later stage of manufacture. In the example shown in FIG. 6C, encapsulant 32 can be provided in grooves 31*a*. In some examples, encapsulant 32 can comprise similar elements, features, materials, or formation processes to those of encapsulant 12 previously described. Lower side 314 of substrate 31 can be substantially coplanar with the bottom side of encapsulant 32. In some examples, encapsulant 32 can be positioned between portion 311*g* and portion 311*s*. Encapsulant 32 can support substrate 31 by providing structural connection between portions 311*g* and 311*s*. Encapsulant 32 can electrically isolate portion 311*g* from portion 311*s*.

Figures 6D, 6E:
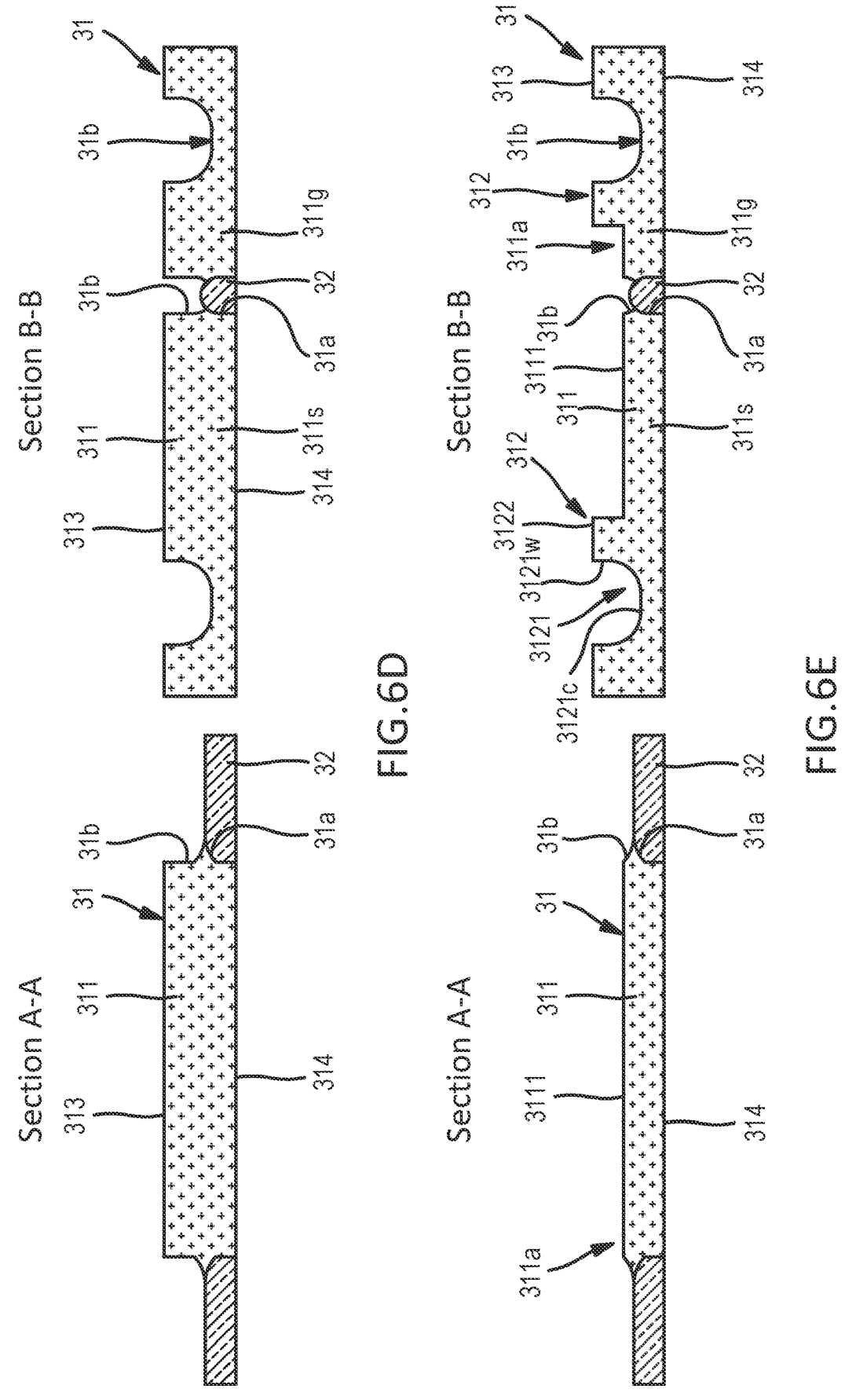

FIG. 6D shows a cross-sectional view of electronic device 30 at a later stage of manufacture. In the example shown in FIG. 6D, grooves 31*b* can be provided in upper side 313 of substrate 31. In some examples, grooves 31*b* can comprise similar elements, features, materials, or formation processes to those of grooves 21*b* previously described. Grooves 31*b* can extend to and expose encapsulant 32 from upper side 313 of substrate 31. Encapsulant 32 can be exposed from the top and bottom sides of substrate 31. Grooves 31*b* can define lead flanks 3121 of leads 3121. In some examples, groove 31*b* can be vertically aligned with groove 31*a* (i.e., groove 31*b* may directly overlap, at least a portion of, groove 31*a* in the vertical direction) to separate portion 311*g* of substrate 31 from portion 311*s*. In some examples, grooves 31*a* and 31*b* meet at an edge that extends outward from substrate 31. That is, grooves 31*a* and 31*b* form a pointed edge portions for substrate 31. Encapsulant 32 can terminate adjacent to the pointed edge portion as generally illustrated in Section A-A of FIG. 6D. The pointed edge portion of substrate 31 may also be referred to as a non-planar edge portion, a tapered edge portion, a rotated V-shaped edge portion, or a beak-shaped edge portion. In some examples, groove 31*b* is free from or devoid of encapsulant 32.

FIG. 6E shows a cross-sectional view of electronic device 30 at a later stage of manufacture. In the example shown in FIG. 6E, cavity 311*a* can be provided into substrate 31. In some examples, cavity 311*a* can comprise similar elements, features, materials, or formation processes to those of cavity 211*a* previously described. In some examples, cavity 311*a* can be provided by masking and partially etching upper side 313 of substrate 31. Cavity 311*a* can be connected to groove 31*b* extending over encapsulant 32. In some examples, cavity 311*a* can overlap groove 31*b*. The proximal sidewalls of leads 312 can define, at least, a portion of a perimeter or sidewall of cavity 311*a*.

In some examples, base 311 and leads 312 can comprise similar elements, features, materials, or formation processes to those of base 211 and leads 212 previously described. For example, leads 312 comprise lead flanks 3121, which can be similar to lead flanks 2121 of leads 212. Leads 312 comprise bottom side 3122, which may be formed by upper side 313 of substrate 31. Lead flanks 3121 comprise flank ceiling 3121*c* and flank sidewall 3121*w*, which can be similar to flank ceiling 2121*c* and flank sidewall 2121*w*, respectively, of lead flanks 2121. Portions 311*g* and 311*s* can be electrically isolated from each other by grooves 31*a* and 31*b* and by encapsulant 32, and respective leads 312 of portions 311*g* and 311*s* are also electrically isolated from each other. Base 311 may comprise cavity side 3111 and a top side opposite cavity side 3111. The top side of base 311 may be formed by lower side 314 of substrate 31. Leads 312 may extend from cavity side 3111.

Figures 6F, 6G:
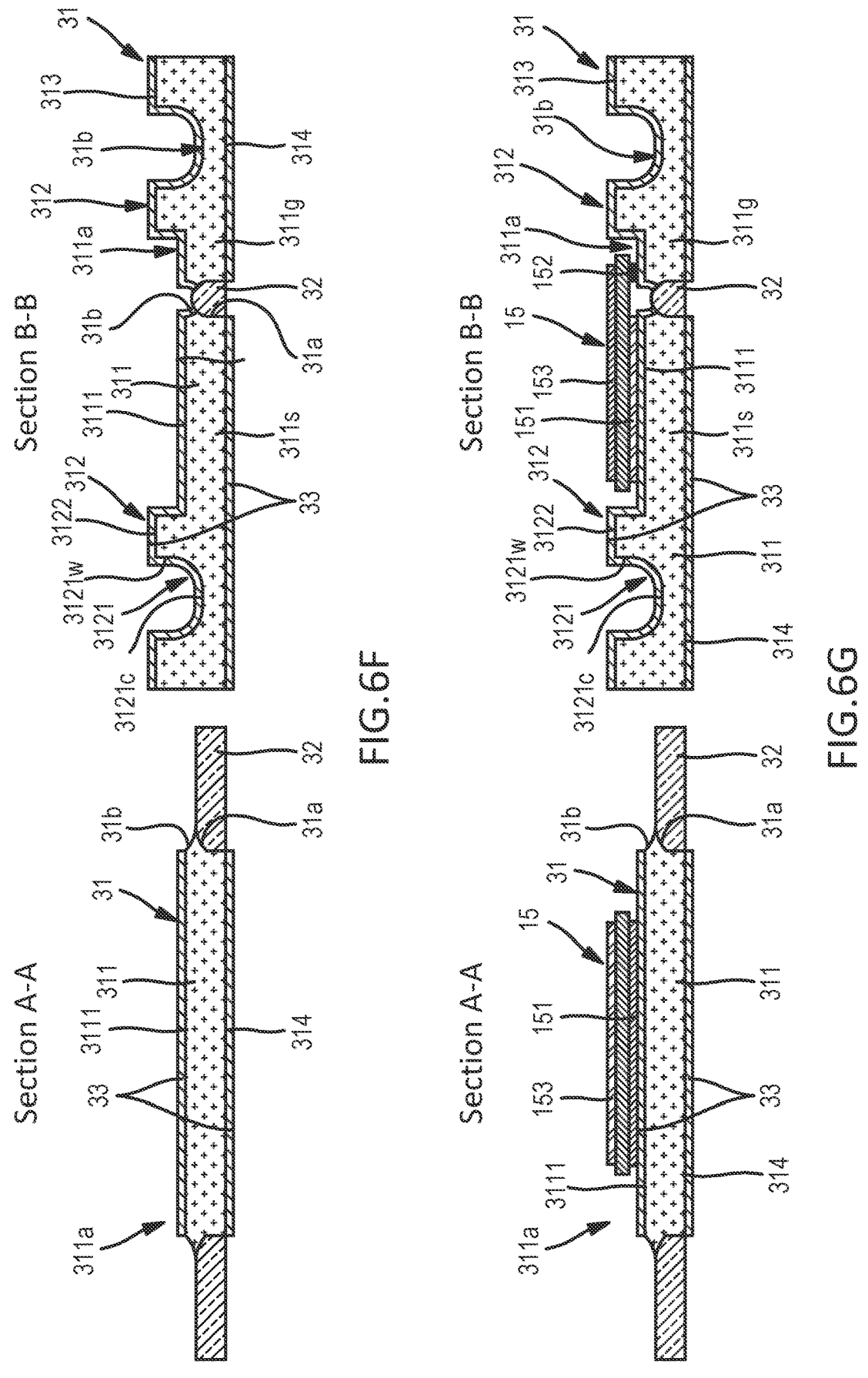

FIG. 6F shows a cross-sectional view of electronic device 30 at a later stage of manufacture. In the example shown in FIG. 6F, coating 33 can be provided on upper side 313 and lower side 314 of substrate 31. Coating 33 can be provided on the surfaces of base 311 (or cavity 311*a*) and leads 312 (or lead flank 3121). In some examples, coating 33 can comprise similar elements, features, materials, or formation processes to those of coating 23 previously described.

FIG. 6G shows a cross-sectional view of electronic device 30 at a later stage of manufacture. In the example shown in FIG. 6G, electronic component 15 can be provided in cavity 311*a* of base 311. Electronic component 15 can be located on cavity side 3111 of base 311. In some examples, electronic component 15 can be coupled to coating 33 on cavity side 3111 similar to electronic component 15 coupled to base 111 previously described with reference to FIG. 2F. Electronic component 15 can be coupled to base 311 so as to allow terminals 151 and 152 to be in contact with coating 33. Terminals 151 and 152 of electronic component 15 can be respectively coupled to portions 311*s* and 311*g* of substrate 31. For example, portion 311*g* can serve as a trace along which control signals flow between terminal 152 of electronic component 151 and lead(s) 312 coupled to portion 311*g*. Portion 311*s* can serve as a paddle or traces along which power signal can flow between terminal 151 of electronic component 151 and lead(s) 312 coupled to portion 311*s*. Encapsulant 32 can maintain portions 311*s* and 311*g* electrically isolated from each other. Terminal 153 of electronic component 15 can remain exposed from cavity 311*a* (e.g., terminal 153 can be oriented away from or distal to the floor of cavity 311*a* and facing the outer opening of cavity 311*a*).

Figures 6H, 6I:
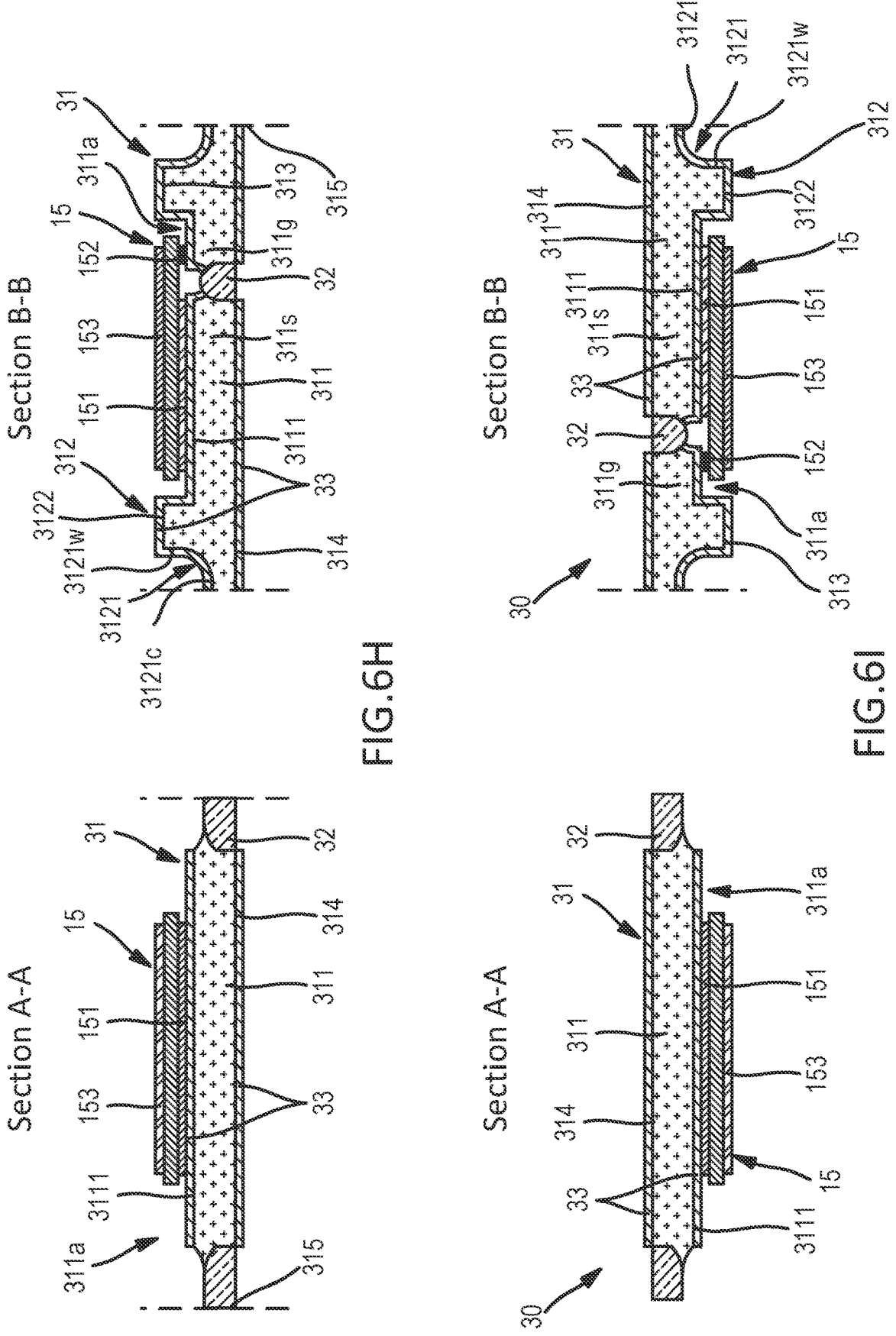

FIG. 6H shows a cross-sectional view of electronic device 30 at a later stage of manufacture. In the example shown in FIG. 6H, a singulation process can be carried out. In some examples, the singulation process can use a sawing tool, such as a diamond blade, or a laser beam, to separate individual substrates 31 from each other. The sawing tool can cut through saw lines 315, which can be located under (e.g., vertically aligned with) grooves 31*b*, to singulate substrate 31. Lead flank 3121 can be exposed at the lateral side of substrate 31. The sawing tool can cut through encapsulant 32 and substrate 31 simultaneously.

In the example shown in FIG. 6I, substrate 31 can be flipped, and electronic device 30 having electronic component 15 exposed at bottom side of electronic device 30 can be provided. Terminal 153 of electronic component 15 can be exposed at the bottom side of electronic device 30 (face-down). Terminal 153 can be substantially coplanar with leads 312 or substantially coplanar with coating 33 on the bottom sides 3122 of leads 312. In the present example, encapsulant 32 can be exposed along each side of base 311 as viewed from the top side of base 311 as illustrated in FIG. 5A. That is, the top side of base 311, which is opposite to cavity 311*a*, is bounded on each side by encapsulant 32. As viewed from the bottom side of electronic device 30, encapsulant 32 includes two continuous segments bounding cavity 211*a* on opposite sides and two discontinuous segments bounding cavity 311*a* between leads 312 on opposite sides as illustrated in FIG. 5B. The two continuous segments and the two discontinuous segments are exposed at the top side of base 311 as illustrated in FIG. 5A. As illustrated in FIG. 5A, electronic device 30 has one portion of the discontinuous segment of encapsulant 32 coupled to one of the continuous segments of encapsulant 32, which electrically isolates portion 311*g* from portion 311*s*. In some examples, leads 312 are integral with base 311 (including portion 311*g* and portion 311*s*) in that they are formed from the same work piece.

From all of the foregoing, one of ordinary skill in the art will appreciate that in an example, the leads are integral with the base. In another example, the leads comprise inner sidewalls, the electronic component comprises a component lateral side connecting the component first side to the component second side, and the inner sidewalls overlap the component lateral side. In a further example, the encapsulant is exposed from the top side of the base. In a still further example, providing the electronic component can comprise providing the electronic component with a third terminal on the component first side. A method can further comprise providing a conductive coating over the lead bottom sides and coupling the second terminal to the cavity side can comprise providing the first terminal and the second terminal substantially coplanar with the conductive coating on the lead bottom sides.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A semiconductor device, comprising:
a substrate comprising:
a base comprising a top side and a cavity side opposite to the top side;
leads extending from the cavity side; and
an encapsulant interposed between the leads; and
an electronic component located on the cavity side and comprising component lateral sides, wherein the component lateral sides are devoid of the encapsulant,
wherein:
the electronic component comprises a component first side, a component second side opposite to the component first side, a first terminal on the component first side, and a second terminal on the component second side;
the component lateral sides connect the component first side to the component second side;

the second terminal is proximal to and coupled to the cavity side;

the base couples the second terminal to a first lead of the leads;

the first terminal is distal to the cavity side;

the leads comprise lead bottom sides and lead flanks;

the base comprises a first groove extending partially inward from the top side of the base and a second groove extending partially inward from the cavity side of the base;

the first groove comprises first groove sidewalls;

the second groove comprises second groove sidewalls;

the encapsulant covers the first groove sidewalls;

the second groove sidewalls are devoid of the encapsulant;

the first groove and the second groove form a pointed edge portion between the leads;

the lead flanks comprise:

flank sidewalls connected the lead bottom sides; and flank ceilings connected to the flank sidewalls;

the semiconductor device further comprises a conductive coating over the lead bottom sides, the flank sidewalls, and the flank ceilings; and the lead bottom sides, the flank sidewalls, and the flank ceilings are exposed from the encapsulant.

2. The semiconductor device of claim 1, wherein:

the electronic component comprises a third terminal at the component first side; and the first terminal and the third terminal are substantially coplanar with the conductive coating at the lead bottom sides.

3. The semiconductor device of claim 1, wherein:

the base comprises a first portion and a second portion;

the encapsulant isolates the first portion from the second portion;

the first lead of the leads extends from the cavity side of the first portion of the base;

a second lead of the leads extends from the cavity side of the second portion of the base;

the electronic component comprises a third terminal on the component second side;

the second terminal is coupled to the first portion of the base;

the third terminal is coupled to the second portion of the base;

the first portion of the base couples the second terminal to the first lead; and the second portion of the base couples the third terminal to the second lead.

4. The semiconductor device of claim 1, wherein:

each of the leads comprises:

a proximal side oriented toward the electronic component;

a distal side opposite to the proximal side;

a first lateral side extending from the proximal side to the distal side, and a second lateral side opposite to the first lateral side and extending from the proximal side to the distal side;

the distal side is oriented away from electronic device;

the first lateral side and the second lateral side are each oriented toward the encapsulant; and the encapsulant is recessed with respect to the proximal side of each of the leads.

5. The semiconductor device of claim 1, wherein:

the leads comprise inner lead sides opposite to the lead flanks and facing the electronic component; and the conductive coating covers the lead flanks, the second groove sidewalls, the inner lead sides, the cavity side, and the top side.

6. The semiconductor device of claim 1, wherein:

the encapsulant is exposed from the top side.

7. The semiconductor device of claim 1, wherein:

the base comprises a base lateral side; and the encapsulant comprises:

a first continuous segment at a first part of the base lateral side as viewed from the top side of the base;

a first discontinuous segment at a second part of the base lateral side as viewed from the top side of the base;

the first part comprises a first length; and the second part comprises a second length less than the first length.

8. An electronic device, comprising:

a molded substrate comprising:

a base comprising a top side and a cavity side opposite to the top side;

leads extending from the cavity side of the base; and an encapsulant interposed between the leads; and an electronic component disposed on the cavity side of the base and including a component first side, a component second side opposite the component first side, component lateral sides connecting the component first side to the component second side; a first terminal on the component first side, and a second terminal on the component second side;

wherein:

the component lateral sides are devoid of the encapsulant;

the second terminal is coupled to the cavity side of the base;

the base couples the second terminal to a first lead of the leads;

the base comprises a first groove extending partially inward from the top side of the base and a second groove extending partially inward from the cavity side of the base;

the first groove comprises first groove sidewalls;

the second groove comprises second groove sidewalls;

the encapsulant covers the first groove sidewalls;

the second groove sidewalls are devoid of the encapsulant;

the first groove and the second groove form a pointed edge portion between the leads;

the leads comprise:

lead flanks that are outward facing;

lead inner sides opposite to the lead flanks;

lead lateral sides connecting the lead flanks to the lead inner sides; and lead bottom sides;

the encapsulant is between the lead lateral sides; and the lead flanks and the lead bottom sides are exposed from the encapsulant.

9. The electronic device of claim 8, further comprising:

a conductive coating over the lead bottom sides, the second groove sidewalls, and the lead flanks.

10. The electronic device of claim 9, wherein:

the first terminal is substantially coplanar with the conductive coating over the lead bottom sides.

11. The electronic device of claim 8, wherein:

the base comprises a first portion and a second portion;

the encapsulant isolates the first portion from the second portion;

the first lead of the leads extends from the cavity side of the first portion of the base;

a second lead of the leads extends from the cavity side of the second portion of the base;

the electronic component comprises a third terminal on the component second side;

the second terminal is coupled to the first portion of the base;

the third terminal is coupled to the second portion of the base;

the first portion of the base couples the second terminal to the first lead; and the second portion of the base couples the third terminal to the second lead.

12. The electronic device of claim 8, wherein:

the base and the leads comprise a selectively patterned conductive structure;

inner sides of the leads are exposed from the encapsulant;

the electronic component comprises a third terminal at the component first side laterally separated from the first terminal;

the electronic component comprises a power semiconductor device;

the first terminal comprises a first current carrying electrode;

the second terminal comprises a second current carrying electrode; and the third terminal comprises a control terminal.

13. A method for manufacturing a semiconductor device, comprising:

providing a substrate comprising:

a base having a top side and a cavity side opposite to the top side;

leads extending from the cavity side;

an encapsulant interposed between the leads; and a conductive coating; and coupling an electronic component to the cavity side comprising component lateral sides, wherein the component lateral sides are devoid of the encapsulant;

wherein:

the electronic component comprises a component first side, a component second side opposite to the component first side, a first terminal on the component first side, and a second terminal on the component second side;

the component lateral sides connect the component first side to the component second side;

the second terminal is proximal to and coupled to the cavity side;

the base couples the second terminal to a first lead of the leads;

the first terminal is distal to the cavity side;

the leads comprise lead bottom sides and lead flanks;

the base comprises a first groove extending partially inward from the top side of the base and a second groove extending partially inward from the cavity side of the base;

the first groove comprises first groove sidewalls;

the second groove comprises second groove sidewalls;

the encapsulant covers the first groove sidewalls;

the second groove sidewalls are devoid of the encapsulant;

the first groove and the second groove form a pointed edge portion between the leads;

the lead flanks comprise:

flank sidewalls connected the lead bottom sides; and flank ceilings connected to the flank sidewalls; and the conductive coating is over the lead bottom sides, the flank sidewalls, and the flank ceilings; and the lead bottom sides, the flank sidewalls, and the flank ceilings are exposed from the encapsulant.

14. The method of claim 13, wherein:

providing the substrate comprises:

providing the base comprising a first portion and a second portion;

providing the encapsulant isolating the first portion from the second portion;

providing the first lead of the leads extending from the cavity side of the first portion of the base; and providing a second lead of the leads extending from the cavity side of the second portion of the base;

providing the electronic component comprises providing the electronic component with a third terminal on the component second side;

the method further comprises coupling the third terminal to the cavity side of the second portion of the base; and coupling the second terminal comprises coupling the second terminal to the cavity side of the first portion of the base;

wherein:

the first portion couples the second terminal to the first lead; and the second portion couples the third terminal to the second lead.

15. The method of claim 13, wherein:

providing the substrate comprises:

providing a conductive plate having a plate upper side and a plate lower side opposite to the plate upper side;

selectively removing first portions of the conductive plate to form upper grooves including the first groove extending inward from the plate lower side, the upper grooves laterally spaced apart with the leads interposed between the upper grooves;

providing the encapsulant in the upper grooves;

selectively removing a second portion of the conductive plate to form the cavity side;

selectively removing third portions of the conductive plate to form lower grooves including the second groove that define the lead flanks; and singulating the conductive plate through the encapsulant and the lower grooves.

16. The method of claim 15, wherein:

selectively removing the second portion comprises selectively removing from the plate lower side;

selectively removing the third portions comprises removing from the plate lower side; and the plate upper side provides the top side of the base.

17. The method of claim 15, wherein:

selectively removing the second portion comprises removing from the plate upper side;

selectively removing the third portions comprises removing from the plate upper side;

selectively removing the third portions exposes the encapsulant in the lower grooves; and the plate lower side provides the top side of the base.

* * * * *